(12) United States Patent
Wu et al.

(10) Patent No.: US 12,660,582 B2
(45) Date of Patent: Jun. 16, 2026

(54) SELF-ALIGNED INTERCONNECT STRUCTURE AND METHOD OF FORMING THE SAME

(71) Applicant: Taiwan Semiconductor Manufacturing Company, Ltd., Hsin-Chu (TW)

(72) Inventors: Cai-Ling Wu, Hsinchu (TW); Hsiu-Wen Hsueh, Taichung City (TW); Chii-Ping Chen, Hsinchu City (TW); Po-Hsiang Huang, Taipei City (TW); Chi-Feng Lin, Hsinchu City (TW); Neng-Jye Yang, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 452 days.

(21) Appl. No.: 17/372,092

(22) Filed: Jul. 9, 2021

(65) Prior Publication Data

US 2023/0011792 A1    Jan. 12, 2023

(51) Int. Cl.
 *H01L 21/768*  (2006.01)
 *H01L 21/3213*  (2006.01)
 (Continued)

(52) U.S. Cl.
 CPC ......... *H10W 20/069* (2026.01); *H10P 50/267* (2026.01); *H10W 20/062* (2026.01); *H10W 20/063* (2026.01); *H10W 20/072* (2026.01); *H10W 20/081* (2026.01); *H10W 20/098* (2026.01); *H10W 20/42* (2026.01); *H10W 20/425* (2026.01); *H10W 20/46* (2026.01); *H10W 20/48* (2026.01)

(58) Field of Classification Search
 CPC ........... H01L 23/5226; H01L 21/76885; H01L 21/76837; H01L 21/7682; H01L 21/76897; H01L 21/32136; H01L 21/76802; H01L 21/7684; H01L 23/53252; H01L 23/5329; H01L 21/76834; H01L 21/32139; H01L 21/76877; H01L 21/76829
 See application file for complete search history.

(56) References Cited

U.S. PATENT DOCUMENTS

| | | | |
|---|---|---|---|
| 8,716,841 | B1 | 5/2014 | Chang et al. |
| 8,728,332 | B2 | 5/2014 | Lin et al. |

(Continued)

*Primary Examiner* — Julio J Maldonado
*Assistant Examiner* — Nathan Pridemore
(74) *Attorney, Agent, or Firm* — HAYNES AND BOONE, LLP

(57)                ABSTRACT

The present disclosure provides a method of forming an interconnect structure. The method includes forming a metal layer over a substrate, the metal layer including a first metal; forming a capping layer on the metal layer; patterning the capping layer and the metal layer, thereby forming trenches in the metal layer; depositing a first dielectric layer in the trenches; removing the capping layer, resulting in the first dielectric layer protruding from a top surface of the metal layer; depositing a second dielectric layer over the first dielectric layer and the metal layer; forming an opening in the second dielectric layer, thereby partially exposing the top surface of the metal layer; and forming a conductive feature in the opening and in electrical coupling with the metal layer, the conductive feature including a second metal.

20 Claims, 18 Drawing Sheets

(51) Int. Cl.

| | |
|---|---|
| *H01L 23/522* | (2006.01) |
| *H01L 23/532* | (2006.01) |
| *H10P 50/26* | (2026.01) |
| *H10W 20/00* | (2026.01) |
| *H10W 20/41* | (2026.01) |
| *H10W 20/42* | (2026.01) |
| *H10W 20/46* | (2026.01) |
| *H10W 20/48* | (2026.01) |

(56) References Cited

U.S. PATENT DOCUMENTS

| | | | |
|---|---|---|---|
| 8,736,084 | B2 | 5/2014 | Cheng et al. |
| 8,762,900 | B2 | 6/2014 | Shin et al. |
| 8,764,995 | B2 | 7/2014 | Chang et al. |
| 8,767,178 | B2 | 7/2014 | Lin et al. |
| 8,796,666 | B1 | 8/2014 | Huang et al. |
| 8,802,354 | B2 | 8/2014 | Chang et al. |
| 8,812,999 | B2 | 8/2014 | Liu et al. |
| 8,822,243 | B2 | 9/2014 | Yan et al. |
| 8,828,625 | B2 | 9/2014 | Lu et al. |
| 8,837,810 | B2 | 9/2014 | Chen et al. |
| 8,841,047 | B2 | 9/2014 | Yu et al. |
| 8,841,058 | B2 | 9/2014 | Chang |
| 8,850,366 | B2 | 9/2014 | Liu et al. |
| 8,877,409 | B2 | 11/2014 | Hsu et al. |
| 8,895,234 | B2 | 11/2014 | Chang et al. |
| 8,906,595 | B2 | 12/2014 | Liu et al. |
| 8,945,803 | B2 | 2/2015 | Chen et al. |
| 8,954,899 | B2 | 2/2015 | Wu et al. |
| 8,987,142 | B2 | 3/2015 | Lee et al. |
| 8,987,689 | B2 | 3/2015 | Chen et al. |
| 9,012,132 | B2 | 4/2015 | Chang |
| 9,028,915 | B2 | 5/2015 | Chang et al. |
| 9,046,789 | B2 | 6/2015 | Lin et al. |
| 9,053,279 | B2 | 6/2015 | Chang et al. |
| 9,093,530 | B2 | 7/2015 | Huang et al. |
| 9,099,530 | B2 | 8/2015 | Lin et al. |
| 9,128,384 | B2 | 9/2015 | Lin et al. |
| 9,134,633 | B2 | 9/2015 | Lin et al. |
| 9,146,469 | B2 | 9/2015 | Liu et al. |
| 9,153,478 | B2 | 10/2015 | Liu et al. |
| 9,184,054 | B1 | 11/2015 | Huang et al. |
| 9,213,234 | B2 | 12/2015 | Chang |
| 9,223,220 | B2 | 12/2015 | Chang |
| 9,230,867 | B2 | 1/2016 | Cheng et al. |
| 9,256,123 | B2 | 2/2016 | Shih et al. |
| 9,256,133 | B2 | 2/2016 | Chang |
| 9,269,537 | B2 | 2/2016 | Tseng et al. |
| 9,287,234 | B2 | 3/2016 | Wu et al. |
| 9,304,403 | B2 | 4/2016 | Lin et al. |
| 9,305,799 | B2 | 4/2016 | Chen et al. |
| 9,336,993 | B2 | 5/2016 | Yu |
| 9,367,655 | B2 | 6/2016 | Shih et al. |
| 9,367,661 | B2 | 6/2016 | Jou et al. |
| 9,390,217 | B2 | 7/2016 | Wang et al. |
| 9,404,743 | B2 | 8/2016 | Chiu et al. |
| 9,501,601 | B2 | 11/2016 | Chang et al. |
| 9,529,268 | B2 | 12/2016 | Chang et al. |
| 9,529,959 | B2 | 12/2016 | Wang et al. |
| 9,536,759 | B2 | 1/2017 | Yang et al. |
| 9,548,303 | B2 | 1/2017 | Lee et al. |
| 2015/0262860 | A1* | 9/2015 | Kao ................. H01L 23/53295 438/653 |
| 2017/0033004 | A1* | 2/2017 | Siew ................. H01L 21/76834 |
| 2017/0278786 | A1* | 9/2017 | Inoue ............... H01L 23/53295 |
| 2019/0096695 | A1* | 3/2019 | Mehrotra .......... H01L 21/28562 |
| 2020/0105586 | A1* | 4/2020 | Hsu ................... H01L 29/41725 |
| 2021/0125856 | A1* | 4/2021 | Ahn ................. H01L 21/76801 |
| 2022/0199516 | A1* | 6/2022 | Chebiam .............. H01L 23/528 |

* cited by examiner

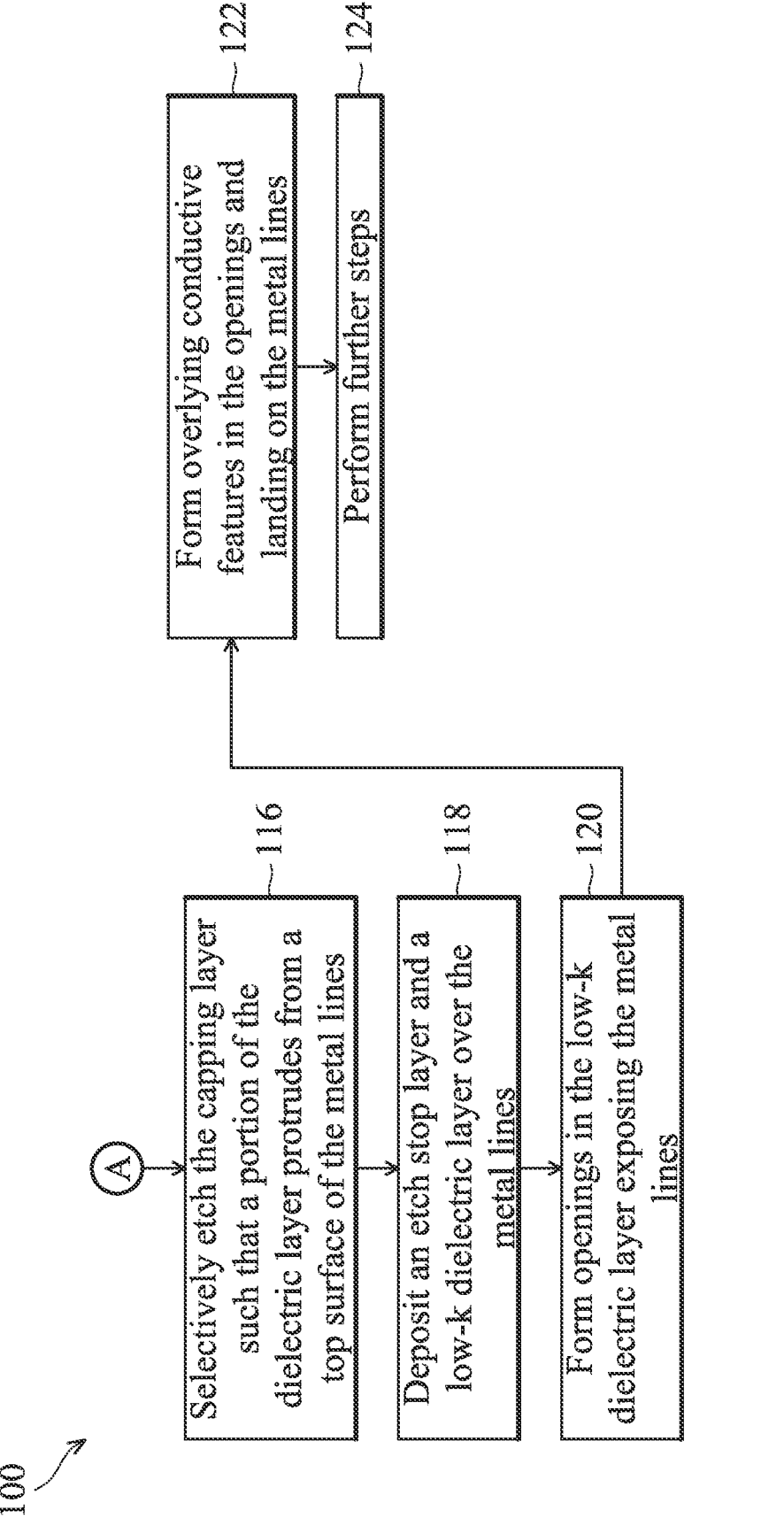

100

A

Selectively etch the capping layer such that a portion of the dielectric layer protrudes from a top surface of the metal lines — 116

Deposit an etch stop layer and a low-k dielectric layer over the metal lines — 118

Form openings in the low-k dielectric layer exposing the metal lines — 120

Form overlying conductive features in the openings and landing on the metal lines — 122

Perform further steps — 124

SELF-ALIGNED INTERCONNECT STRUCTURE AND METHOD OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

As a part of the semiconductor fabrication, conductive elements are formed to provide electrical interconnections for the various components of an IC. For example, conductive vias for interconnecting different metal layers may be formed by etching openings in a dielectric material layer and filling the openings with a conductive material. However, as semiconductor fabrication technology nodes continue to evolve, critical dimensions and pitches are becoming smaller and smaller, and the process windows are becoming tighter. Consequently, overlay errors (e.g., misaligned vias) may occur, which may lead to problems such as reduced reliability test margin or poor device performance. Therefore, while processes for interconnect structure formation have generally been adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 1A and 1B illustrate a flow chart of a method for forming self-aligned interconnect structure according to various aspects of the present disclosure.

DETAILED DESCRIPTION

Figure 1A:
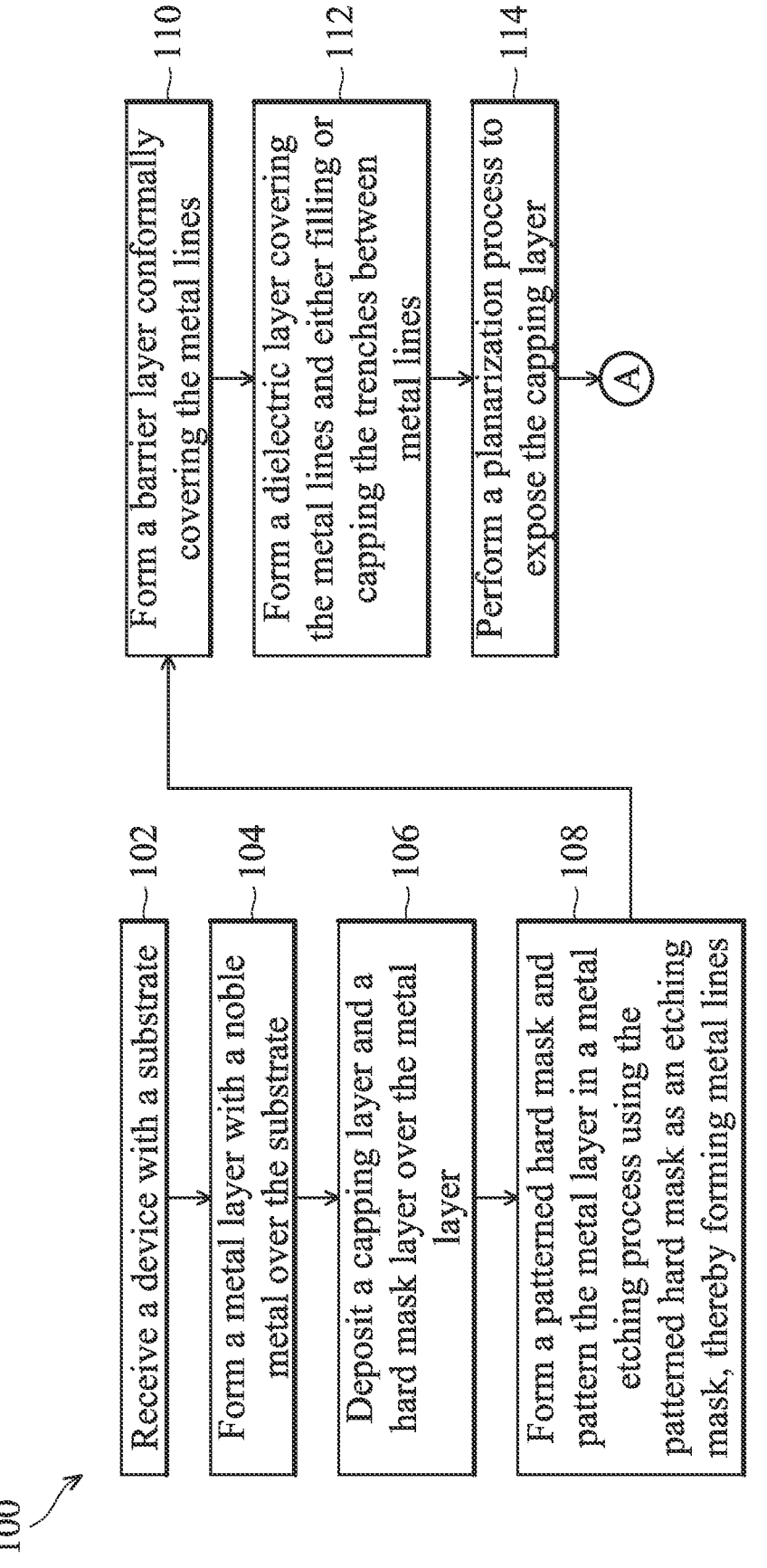

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

An integrated circuit (IC) contains a plurality of patterned metal lines separated by inter-wiring spacings. Metal lines formed in trench-like openings typically extend substantially parallel to the semiconductor substrate. Semiconductor devices of such type, according to current technology, may comprise eight or more levels of metallization layers to satisfy device geometry and micro-miniaturization requirements. As a part of semiconductor fabrication, electrical interconnections need to be formed to electrically interconnect the various metallization layers, as well as other microelectronic elements (e.g., source/drain, gate, etc.), of a semiconductor device. Generally, this involves forming openings in layers (such as in electrically insulating layers), and subsequently filling these openings with an electrically conductive material. The electrically conductive material is then polished to form the electrical interconnections such as metal lines or vias.

However, as semiconductor technology generations continue the scaling-down process, accurate alignment or overlay may become problematic due to the ever-decreasing trench sizes. For example, it may be more difficult for vias to be accurately aligned with underneath metal lines. When via misalignment or overlay problems occur, conventional methods of fabrication may lead to undesirable over-etching of a dielectric material (e.g., an inter-layer dielectric layer (ILD)) below the via opening. When the via opening is later filled with a metal material, its elongated protruding shape resembles a tiger tooth. Such "tiger tooth" via may lead to poor leakage and reliability performance. Tighter process windows may need to be used to avoid these problems, but that may degrade device performance as well.

The present disclosure is generally related to interconnect structures in integrated circuits, and more particularly to self-aligned interconnect structures and methods thereof in an effort of improving via alignment and avoiding over-etching of dielectric material during via formation. In embodiments of the present disclosure, the method allows the dielectric material to protrude from a metal layer in forming a buffering top portion against later over-etching during via formation, which enlarges the process window without sacrificing performance. Also, the method combines metal etching process and damascene process in forming metal lines with different critical dimensions (CDs), allowing narrow metal lines to be formed of a noble metal, avoiding copper's otherwise problematic filling capability in narrow trench-like openings. Furthermore, in embodiments of the present disclosure, the method allows forming air gaps between metal lines, resulting in an air-gap-containing interconnect structure, which provides reduced RC time constant for advanced semiconductor devices. The various aspects of the present disclosure will now be discussed in more detail with reference to FIGS. 1A-14B.

FIGS. 1A and 1B illustrate a flow chart of a method 100, constructed according to various aspects of the present disclosure. The method 100 is an example and is not intended to limit the present disclosure beyond what is explicitly recited in the claims. Additional operations can be provided before, during, and after the method 100, and some operations described can be replaced, eliminated, or relocated for additional embodiments of the method. The method 100 is described below in conjunction with FIGS. 2-14B, which graphically illustrate some principles of the method 100. FIGS. 2-14B illustrate cross-sectional views of an exemplary integrated circuit 200 during various fabrication stages of the method 100 in accordance with some embodiments.

Figure 2:
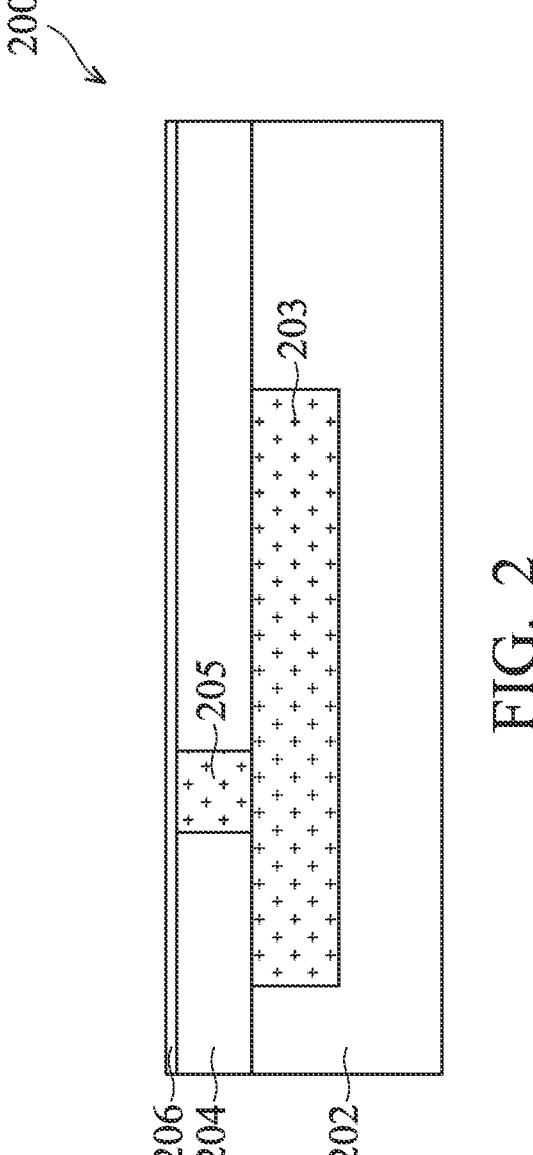
FIGS. 2, 3, 4, 5, 6, 7A, 7B, 7C, 8, 9, 10, 11, 12, 13, 14A, and 14B are cross-sectional views of a portion of a semiconductor device in various fabrication stages according to some embodiments of the method in FIGS. 1A and 1B.

Referring to FIG. 1A, the method 100 begins at operation 102 by providing or receiving a semiconductor device (or device) 200 including a substrate 202 as illustrated in FIG. 2. In some embodiments, the substrate 202 includes silicon. Alternatively, the substrate 202 may include other elementary semiconductor such as germanium in accordance with some embodiments. In some embodiments, the substrate 202 additionally or alternatively includes a compound semiconductor such as silicon carbide, gallium arsenic, indium arsenide, and indium phosphide. In some embodiments, the substrate 202 includes an alloy semiconductor such as silicon germanium, silicon germanium carbide, gallium arsenic phosphide, and gallium indium phosphide.

In some embodiments, the substrate 202 includes a semiconductor-on-insulator (SOI) structure. For example, the substrate may include a buried oxide (BOX) layer formed by a process such as separation by implanted oxygen (SIMOX). In various embodiments, the substrate 202 includes various p-type doped regions and/or n-type doped regions, such as p-type wells, n-type wells, p-type source/drain features and/or n-type source/drain features, formed by a process such as ion implantation and/or diffusion. The substrate 202 may further include other functional features such as a resistor, a capacitor, diode, transistors (e.g., field effect transistors (FETs)), as well as source/drain contacts and gate contacts that extend to and electrically couple to source/drain features and gate structures of transistors underneath. In the present embodiment, a source/drain contact 203 disposed in a top portion of the substrate 202 is illustrated. The substrate 202 may include lateral isolation features configured to separate various devices formed on the substrate 202.

The device 200 includes a via-level inter-level dielectric (ILD) layer 204 deposited above the substrate 202. In some embodiments, the via-level ILD layer 204 may comprise dielectric material such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The dielectric material may be formed by plasma-enhanced chemical vapor deposition (PECVD), flowable chemical vapor deposition (FCVD), or other suitable methods. In some embodiments, the dielectric material is formed of a low-k (e.g., a dielectric constant value around 3.5) dielectric material or an extreme low-k (e.g., a dielectric constant value around 2.5) dielectric material, such as carbon-containing dielectric materials, and may further contain nitrogen, hydrogen, oxygen, and combinations thereof. If an extreme low-k dielectric material is used, a curing process may be followed after depositing the extreme low-k dielectric material to increase its porosity, lower the k value, and improve the mechanical strengths. The operation 102 may also include performing one or more chemical-mechanical polishing (CMP) processes to planarize the top surface of the device 200. The via-level ILD layer 204 includes vias that extend through the via-level ILD layer 204 and provide electrical coupling to the contact features in the substrate 202. In the present embodiment, a contact via 205 is illustrated. The contact via 205 extends to and electrically couple to the source/drain contact 203 underneath. In some embodiments, the device 200 further includes one or more inter-metal dielectric (IMD) layers (not shown) deposited above the via-level ILD layer 204. Each of the IMD layers may have a thickness ranging from about 200 Å to about 1000 Å. The IMD layers provide electrical insulation as well as structural support for a multi-layer interconnect structures. Multi-layer interconnect structures may include a plurality of metallization layers and may further include vias or contacts of the interconnect features (e.g., back-end-of-the-line (BEOL) features) disposed in the IMD layers. For example, a metallization layer (e.g., metal 0 (M0), metal 1 (M1), etc.) includes a plurality of conductive features (e.g., metal lines, contacts, and/or vias) embedded in the IMD layers.

The device 200 further includes a glue layer 206 deposited above the via-level ILD layer 204. The glue layer 206 functionally provides adhesion between the via-level ILD layer 204 and a subsequently deposited metal layer thereon. The glue layer 206 also functions as an etch stop layer and provides end point control during subsequent etching processes. Material compositions of the glue layer 206 are selected such that an etch selectivity exists between the glue layer and the metal layer to form thereon, such that an etching process etching through the metal layer stops at the glue layer 206 without causing etching damages to the underlaying layer(s). The glue layer 206 may comprise titanium nitride (TiN) or tungsten nitride (WN). In some embodiments, the glue layer 206 has a thickness ranging from about 10 Å to about 30 Å.

Figure 3:
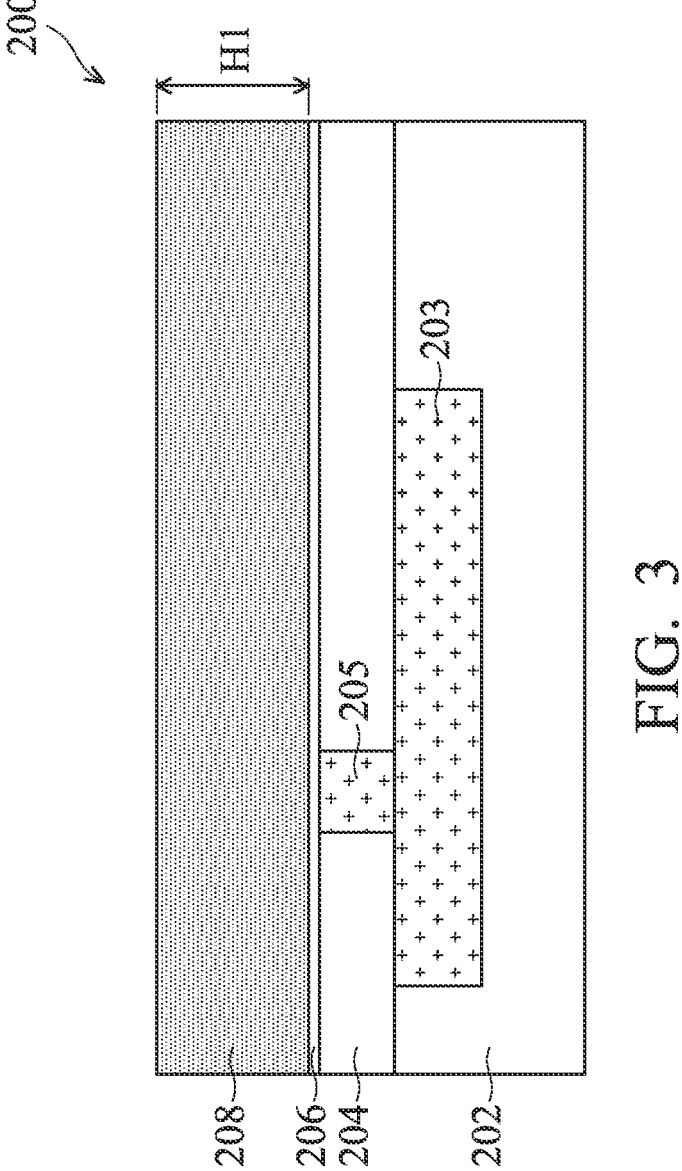

At operation 104, the method 100 (FIG. 1A) forms a metal layer 208 over the glue layer 206, such as shown in FIG. 3. As will be discussed in later section of the present disclosure, the metal layer 208 is to pattern into metal lines that electrically couple to the contact via 205 and the source/drain contact 203 underneath.

A common process for forming metal lines or vias is known as "damascene" process. Generally, a damascene process involves forming trench-like openings in an IMD layer. A trench-like opening is typically formed using conventional lithographic and etching techniques. After the trench-like opening is formed, a diffusion barrier layer and an adhesion layer are deposited within the trench-like opening. An electro-chemical plating process is then used to fill the trench-like opening with metal or metal alloys to form a metal line and possibly a via underneath the metal line as well. Excess metal material on the surface of the IMD layer is then removed by a CMP process.

With increasing packing density in microelectronic devices, copper (Cu) has been used as an interconnecting metal among other available metal materials due to its superior electrical conductivity (5.96×10$^7$ S/m) and excellent resistance against electro migration. The damascene process with copper, which involves copper electroplating followed by a CMP of the copper, has been commonly adopted for patterning copper. At the meantime, as semiconductor device sizes continue to shrink, the damascene process with copper also sees a number of potential problems that may affect the quality of the metallization layers. For example, when a metal line critical dimension (CD) is below 20 nanometer (nm), a trench-like opening may become too narrow and accordingly high aspect ratio, and the stack of diffusion barrier layer and adhesion layer will occupy substantial portions of the openings, leaving less room for the more conductive copper. The remaining smaller amount of copper has higher resistance and thus degrade semiconductor device performance. This problem is particularly acute in high aspect ratio (e.g., >3) trench-like openings of a small width. Moreover, the trench-like openings may not be properly filled by a damascene process, such that the top portion of the openings may be blocked, which may create a void underneath and deteriorate device performance. Besides, narrower copper lines may have a shorter lifetime before consequent higher current density destroys them by electro migration.

As a comparison, noble metals have become technologically important as conductive features in integrated circuits. The term "noble metals" as used herein indicates metals selected from ruthenium (Ru), iridium (Ir), rhodium (Rh), platinum (Pt), palladium (Pd), osmium (Os), silver (Ag), and gold (Au). All other metals are herein categorized as non-noble metals. Unlike some non-noble metals, such as copper, which is not suitable for direct patterning, noble metals can be patterned to form metal lines with a CD less than about 20 nm due to the suitability of being directly patterned in dry etching approaches (e.g., reactive ion etching (RIE) process). In some embodiments, the metal layer 208 includes a noble metal, an alloy of two or more noble metals, or an alloy of noble metal(s) mixed with non-noble metal(s). In some embodiments, the metal layer 208 includes a noble metal selected from the group of Ru, Ir, Rh, and Pt, such as Ru in a specific example. In another embodiment, the metal layer 208 includes alloy of noble metals with noble or non-noble metals, such as PtIr, PdPt, or PdNi. In yet another embodiment, the metal used to form the metal layer 208 is not limited to noble metals, as long as the metal is suitable for direct patterning, such as Cobalt (Co), Molybdenum (Mo), and Tungsten (W). The metal layer 208 may be deposited by chemical vapor deposition (CVD), physical vapor deposition (PVD), electroplating, or other suitable methods. The metal layer 208 may have a thickness H1 ranging from about 250 Å to about 360 Å, in accordance with some embodiments.

Figure 4:
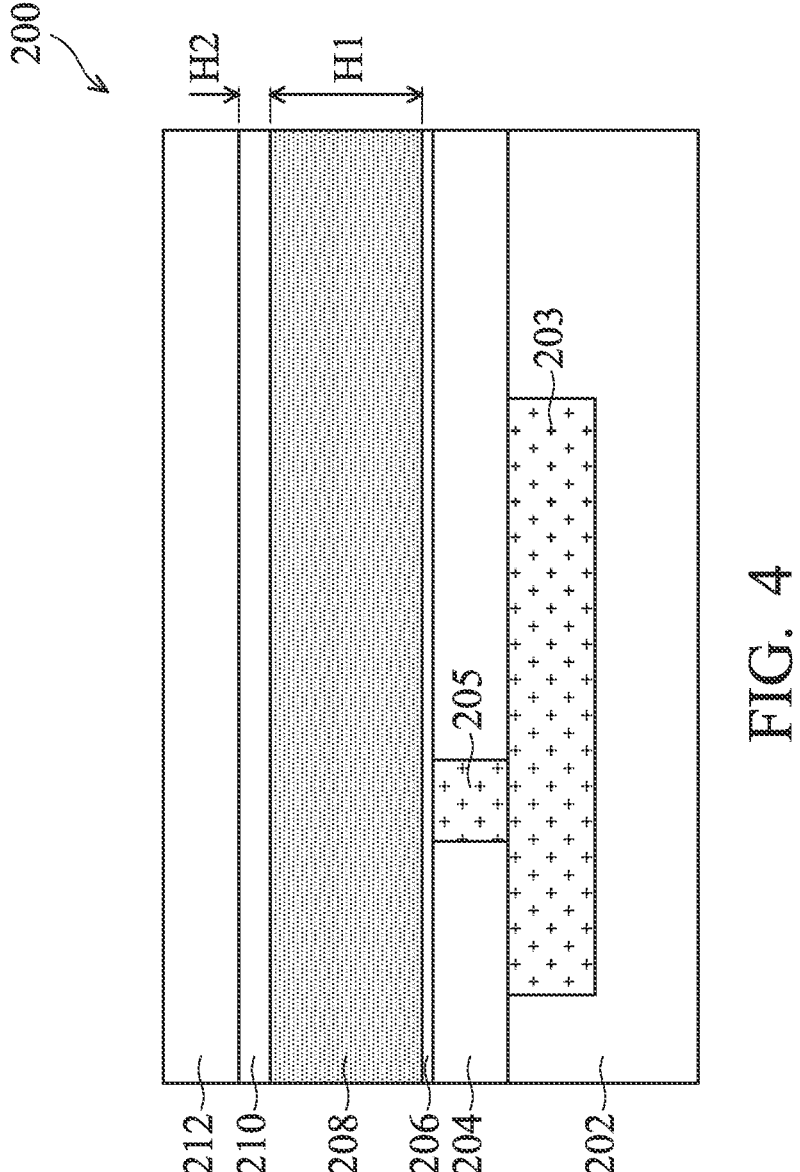

At operation 106, the method 100 (FIG. 1A) deposits a capping layer 210 over the metal layer 208, such as shown in FIG. 4. As will be discussed in later section of the present disclosure, the capping layer 210 defines a distance of a dielectric material protruding from the metal layer 208, which provides a buffering portion against later over etching during via formation. Material compositions of the capping layer 210 are selected such that an etch selectivity exists between the capping layer 210 and the metal layer 208, such that a later etching process removing the capping layer 210 would not cause substantial etching loss to the metal layer 208. In some embodiments, the capping layer 210 is substantially free from nitrogen (N). In furtherance of the embodiments, the capping layer 210 comprises a metal-doped carbide, such as tungsten carbide (WC). The capping layer 210 may be deposited by PVD, Radio Frequency PVD (RFPVD), Atomic Layer Deposition (ALD), or other suitable methods. In some embodiments, the capping layer 210 has a thickness H2 ranging from about 50 Å and about 120 Å. A ratio of H2/H1 is constrained between about ⅕ to about ⅓, in accordance with some embodiments. The thickness H2 of the capping layer 210 is at least ⅕ of the thickness H1 of the metal layer 208 due to film quality requirement. If the thickness H2 of the capping layer 210 is less than about ⅕ of the thickness H1 of the metal layer 208, the film quality is not good enough to be a capping layer. If the thickness H2 of capping layer 210 is larger than about ⅓ of the thickness H1 of the metal layer 208, the subsequently-formed dielectric material may protrude into upper dielectric layer (e.g., an etch stop layer) for a large distance which introduces via under-etching. In some embodiments, the capping layer 210 also functionally serves as an anti-reflective coating (ARC) layer.

Still referring to FIG. 4, the method 100 also forms a hard mask layer 212 over the capping layer 210 at operation 106. Any suitable material or composition may be used in forming the hard mask layer 212, such as a tri-layer hard mask in one example. The exemplary hard mask layer 212 includes a bottom layer, a middle layer, and a top layer (not shown), each with different or at least independent materials. For example, the bottom layer may include tetraethyl orthosilicate (TEOS), a nitrogen free anti-reflective coating (NFAARC) film, oxygen-doped silicon carbide (ODC), silicon carbon nitride (SiCN), or plasma-enhanced oxide (PEOx); the middle layer may include a silicon rich polymer material (e.g., $SiC_xH_yO_z$); the top layer may include tetraethyl orthosilicate (TEOS) or silicon oxide. It is understood that in other embodiments, one or more layers may be omitted and that additional layers may be provided as a part of the tri-layer hard mask.

Figure 5:
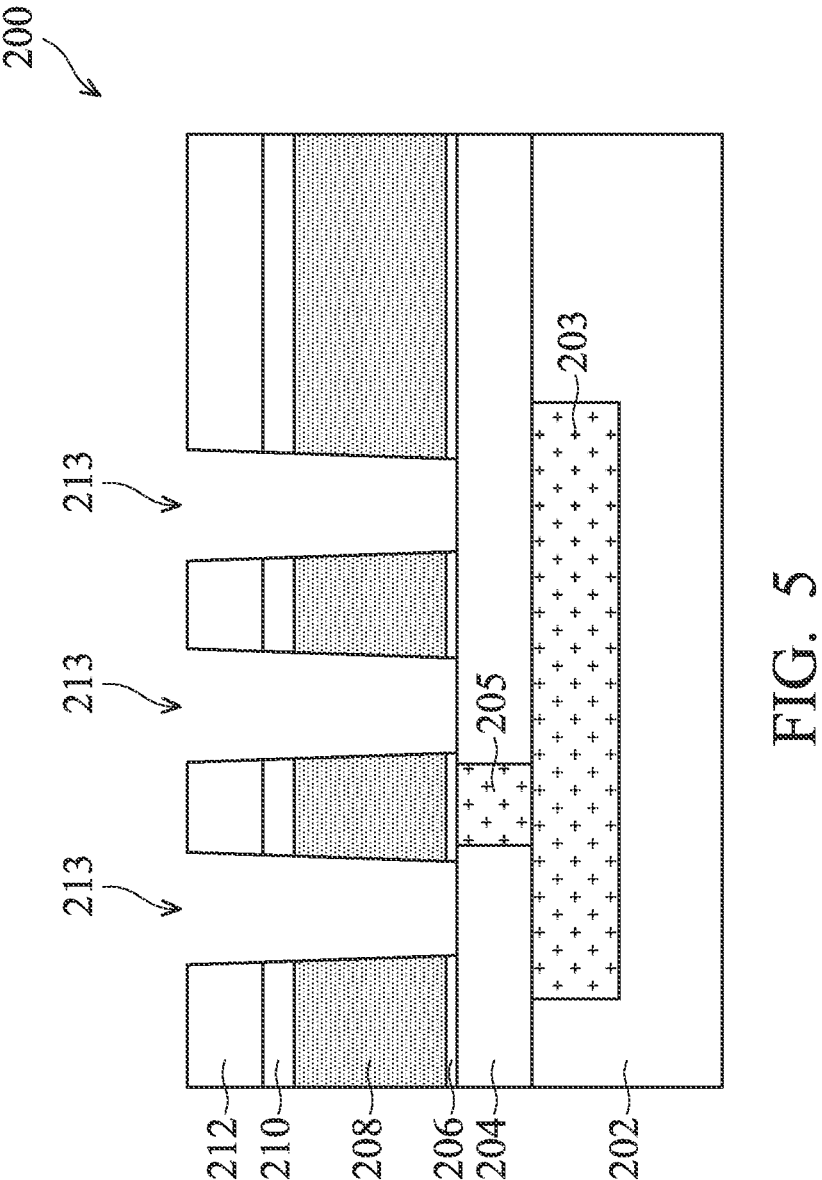

At operation 108, the method 100 (FIG. 1A) patterns the hard mask layer 212 and the capping layer 210 in a lithography process and an etching process, and subsequently patterns the metal layer 208 to form metal lines in a metal etching process. Referring to FIG. 5, trenches 213 are formed after the metal layer 208 are patterned.

The hard mask layer 212 may be patterned using suitable processes including double-patterning processes, multi-patterning processes, photolithography, self-aligned processes, and mandrel-spacer processes to define a pattern of lines to be transferred to the underneath metal layer 208. In the illustrated embodiment, a photoresist layer (not shown) is formed on the hard mask layer 212 using a spin-coating process and soft baking process. Then, the photoresist layer is exposed to a radiation. The radiation may be an extreme ultraviolet (EUV) radiation using a wavelength of 13.6 nm, an ultraviolet radiation using a wavelength of 436 nm, 405 nm, or 365 nm, or a DUV radiation using a wavelength of 248 nm, 193 nm, or 157 nm, or other available radiation for lithography, such as e-beam. Subsequently, the exposed photoresist layer is developed using post-exposure baking (PEB), developing, and hard baking thereby forming a patterned photoresist layer over the hard mask layer 212. The hard mask layer 212 is etched through the openings defined in the patterned photoresist layer, forming a patterned hard mask layer 212. The patterned photoresist layer is removed thereafter using a suitable process, such as wet stripping or plasma ashing. The capping layer 210 is etched through the openings defined in the patterned hard mask layer 212, forming a patterned capping layer 210, as shown in FIG. 5. In one example, the etching process includes applying a dry (or plasma) etch to partially remove the capping layer 210 within the openings defined in the patterned hard mask layer 212. In another example, the etching process includes applying a wet etch with a hydrofluoric acid (HF) solution to partially remove the capping layer 210 within the openings defined in the patterned hard mask layer 212.

Still referring to FIG. 5, the method 100 at operation 108 subsequently etches the metal layer 208 in a metal etching process, using the patterned hard mask layer 212 and the patterned capping layer 210 as an etching mask. In the illustrated embodiment, the metal etching process is a dry etching process, such as a plasma etching process. In furtherance of the embodiment, the metal etching process includes an RIE process. The RIE process may include process parameters such as reactor operating pressure ranging from about 10 mTorr to about 300 mTorr, an RF power less than 2700 W (e.g., ranging from about 900 W to about 1600 W), a bias voltage less than about 4500 W, a temperature ranging from about 10° C. to about 80° C., and an RIE etching period ranging from about 200 seconds to about 500 seconds. The RIE source gas may include an ion composition, such as argon (Ar), a fluorine-containing gas (e.g., $CF_4$, $SF_6$, $CH_2F_2$, $CHF_3$, $C_4F_8$, $C_2F_6$), or a combination thereof. The RIE source gas may further include certain chemical etchants, such as a chlorine-containing gas (e.g., $Cl_2$, $CHCl_3$, $CCl_4$) for chemical etching. In some embodiments, the chemical etchant comprises boron (B) (e.g., $B_2F_4$, $BCl_3$, $B_4Cl_4$, $BBr_3$). In a specific embodiment, the chemical etchant comprises a combination of boron and chlorine. In some embodiments, the total etchant flow rate is less than 1800 sccm, such as about 1200 sccm. The chemical etchant may have a flow rate about 30% to about 50% of the total etchant flow rate, such as about 40%. The resulting metal lines after the patterning of the metal layer 208 may have a critical dimension (CD) within sub-20 nm range. As discussed above, the selection of metal compositions (e.g., noble metal) for the metal layer 208 safeguards bulk metal composition with low resistivity for narrow metal lines. For the sake of simplicity, the metal lines are denoted as the metal lines 208 after operation 108. Trenches 213 are sandwiched between adjacent metal lines 208, exposing the top surface of the glue layer 206. The glue layer 206 protects the via-level ILD layer 204 from the RIE process as an etch stop layer. Subsequently, the exposed portions of the glue layer 206 are etched in another etching process, such as a wet etching, a dry etching, or a combination thereof. The trenches 213 extends downwardly to the top surface of the via-level ILD layer 204. The etching of the hard mask layer 212, the capping layer 210, the metal layer 208, and the glue layer 206 may be in-situ.

Figure 6:
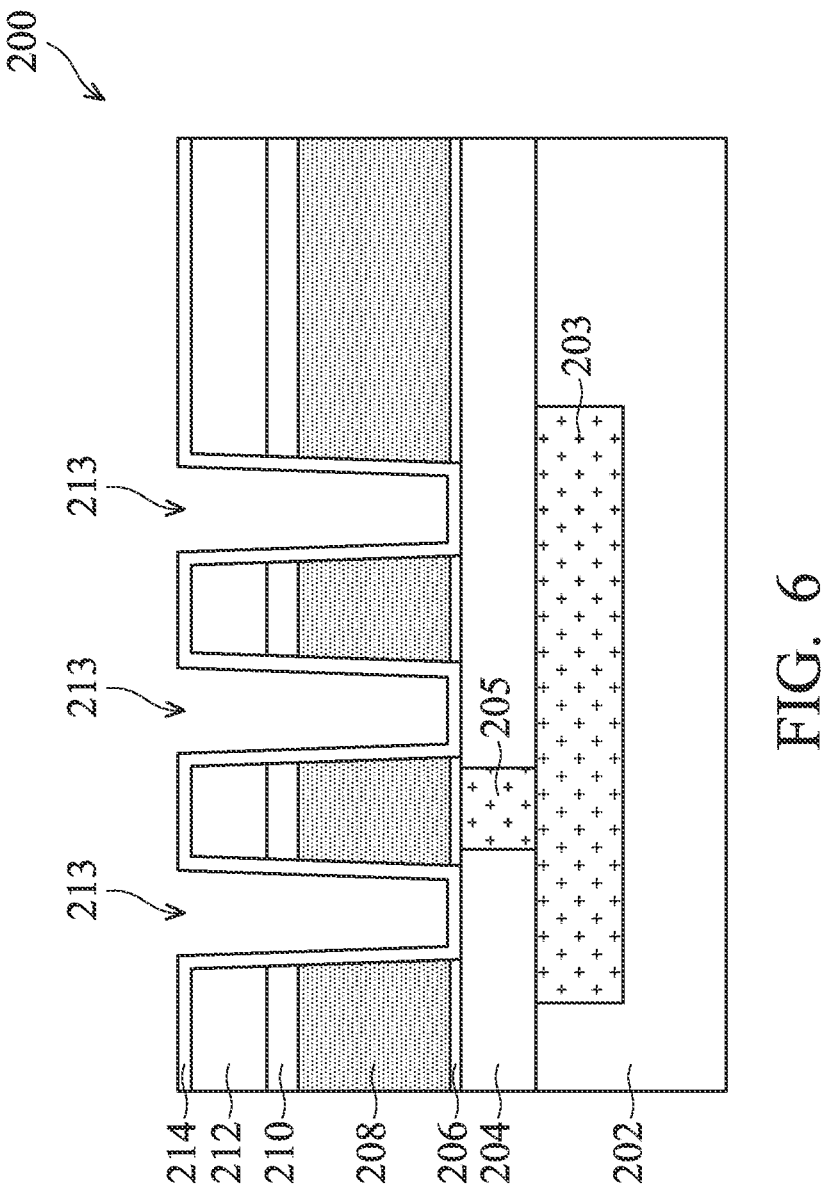

At operation 110, the method 100 (FIG. 1A) forms a barrier layer 214 that is blanket lined over sidewalls and bottom of the trenches 213 and over the hard mask layer 212, such as shown in FIG. 6. The barrier layer 214 blocks diffusion of metal atoms from the metal lines 208 into the dielectric material to be deposited in the trenches 213. The barrier layer 214 may include a nitride based dielectric or a metal oxide based dielectric, such as hafnium oxide ($HfO_2$), tantalum oxide ($Ta_2O_5$), titanium oxide ($TiO_2$), zirconium oxide ($ZrO_2$), aluminum oxide ($Al_2O_3$), yttrium oxide ($Y_2O_3$), or a combination thereof. The barrier layer 214 may alternatively comprise other materials having a high etch selectivity to the material of the capping layer 210. The barrier layer 214 may conformally cover the device 200 with a thickness ranging from about 10 Å to about 20 Å, such as about 12 Å. The barrier layer 214 may be deposited using PVD at a temperature of room temperature to about 400° C., using CVD or plasma enhanced CVD (PECVD) at a temperature of about 200° C. to about 600° C., or using ALD at a temperature of about 80° C. to about 600° C., as examples.

Figure 7A:
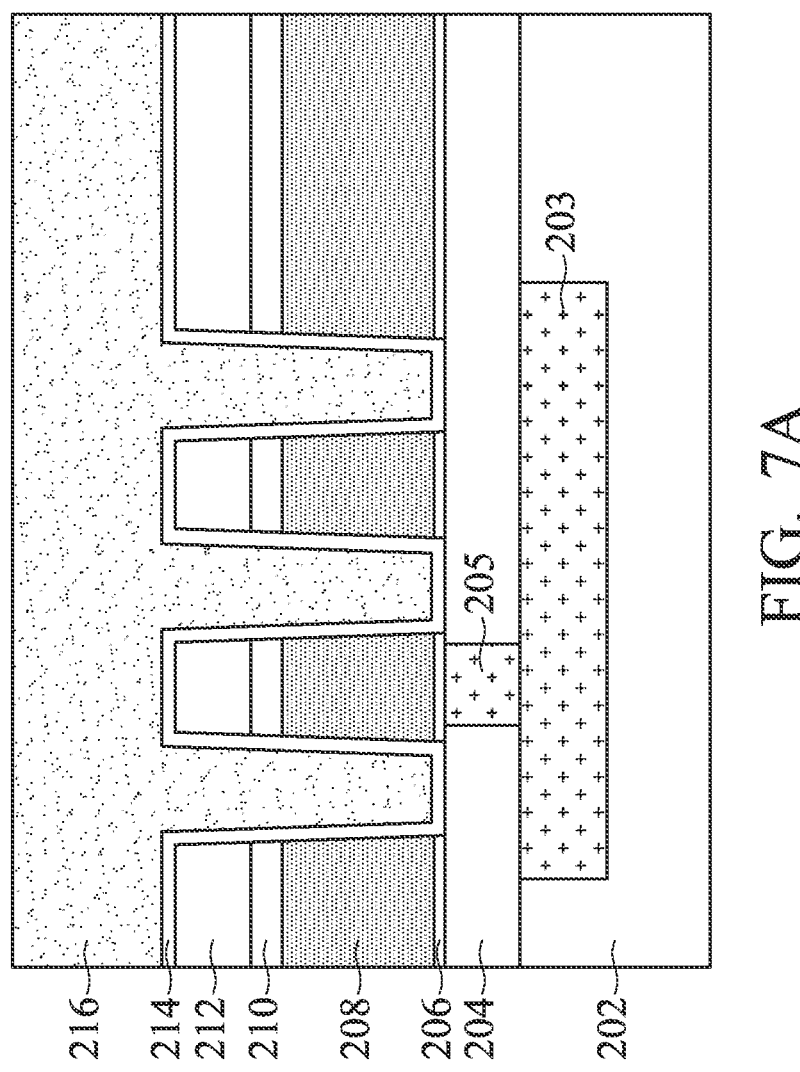

At operation 112, the method 100 (FIG. 1A) deposits a dielectric layer 216 filling the trenches 213 and covering the barrier layer 214, such as shown in FIG. 7A. The dielectric layer 216 may comprise dielectric material such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. Alternatively, the dielectric layer 216 may include a high-k dielectric material such as zirconium oxide ($ZrO_2$). In some other embodiments, the dielectric layer 216 may optionally include silicon oxide ($SiO_2$), silicon nitride (SiN), silicon oxynitride (SiON), or combinations thereof. The dielectric material may be formed by CVD, PECVD, FCVD, PVD, spin-on coating, or other suitable methods.

There is a need for new methods that provide low RC time constants for advanced semiconductor devices, wherein "R" is the resistance of the on-chip wiring and "C" is the effective capacitance between the signal lines and the surrounding conductors in the multilevel interconnection stack. RC time constants are reduced by lowering the specific resistance of the wiring material, and by using dielectrics with lower dielectric constants (k). Traditional semiconductor fabrication commonly employs silicon dioxide ($SiO_2$) as a dielectric, which has a k value of approximately 3.9. In some embodiments, the dielectric material is formed of a low-k (e.g., a dielectric constant value around 3.5) dielectric material or an extreme low-k (e.g., a dielectric constant value around 2.5) dielectric material, such as carbon-containing dielectric materials, and may further contain nitrogen, hydrogen, oxygen, and combinations thereof. If an extreme low-k dielectric material is used, a curing process may be followed after depositing the extreme low-k dielectric material to remove moisture in the extreme low-k dielectric material. In the illustrated embodiment, the dielectric material is deposited in an FCVD process, which has a better gap filling capability such that the trenches 213 are substantially filled up with the dielectric material.

Besides using a low-k or extreme low-k dielectric material, another approach is to implement an air gap, which is provided in the form of an air-gap-containing interconnect structure. Even a small air gap near the metal lines results in a significant improvement in the overall k for a structure, e.g., an air gap from about 35% to about 40% in volume between signal lines will reduce capacitance by approximately 15%. As used herein, the term "air gap" is used to describe a void defined by surrounding substantive features, where a void may contain air, nitrogen, ambient gases, gaseous chemicals used in previous or current processes, or combinations thereof.

Figure 7B:
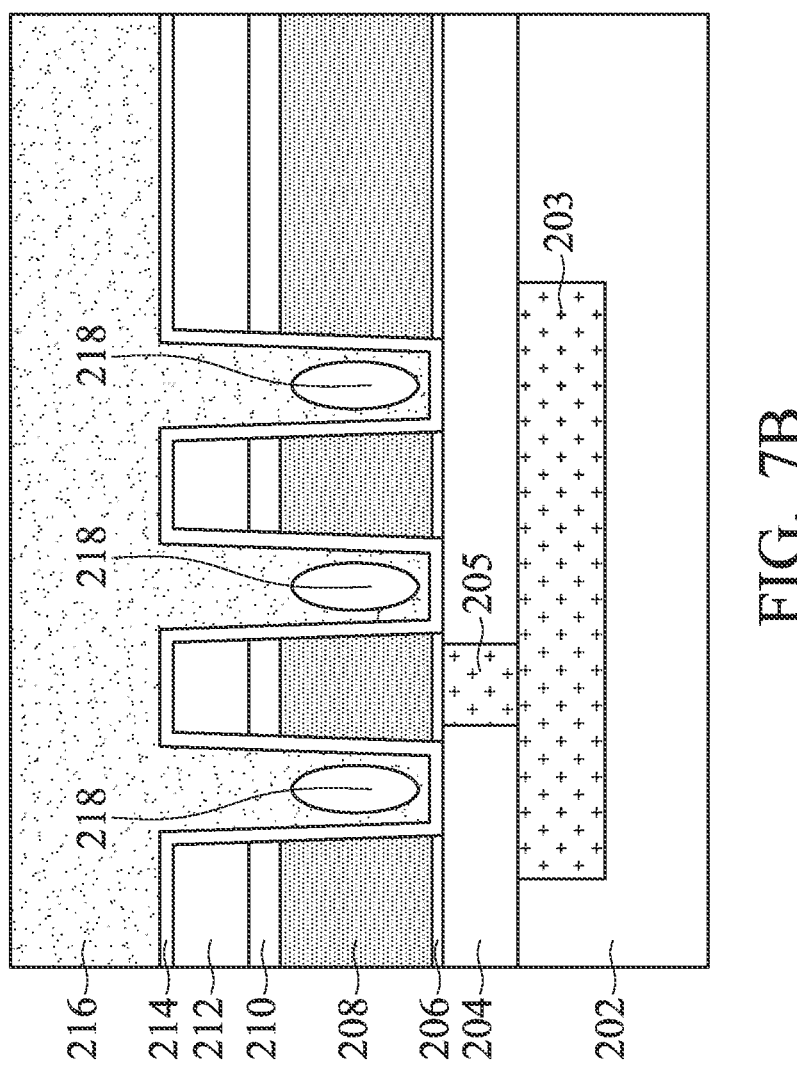

In some embodiments, the deposition process has a poor gap filling capability (e.g., a CVD process), such that the trenches 213 are capped by the dielectric material with air gaps formed therein. Referring to FIG. 7B for such an embodiment, the trenches 213 have a high aspect ratio and the parameters in a deposition process (e.g., pressure, temperature, and gas viscosity of a CVD process) are tuned in a way that the gap fill behavior of depositing dielectric materials cap the air gaps 218 inside the trenches 213 without filling up the trenches. In some embodiments, the air gaps 218 are associated with a k≈1. Accordingly, the air gaps 218 of the interconnect structure facilitates improved RC performance with respect to a continuous dielectric material with a higher k. However, gap materials other than air are contemplated. In some embodiments, an air gap 218 has a width in a range from about 1 Å to about 100 Å. In various embodiments, the air gaps 218 are surrounded by the dielectric material of the dielectric layer 216 and are below the capping layer 210.

Figure 7C:
Figure 7C:
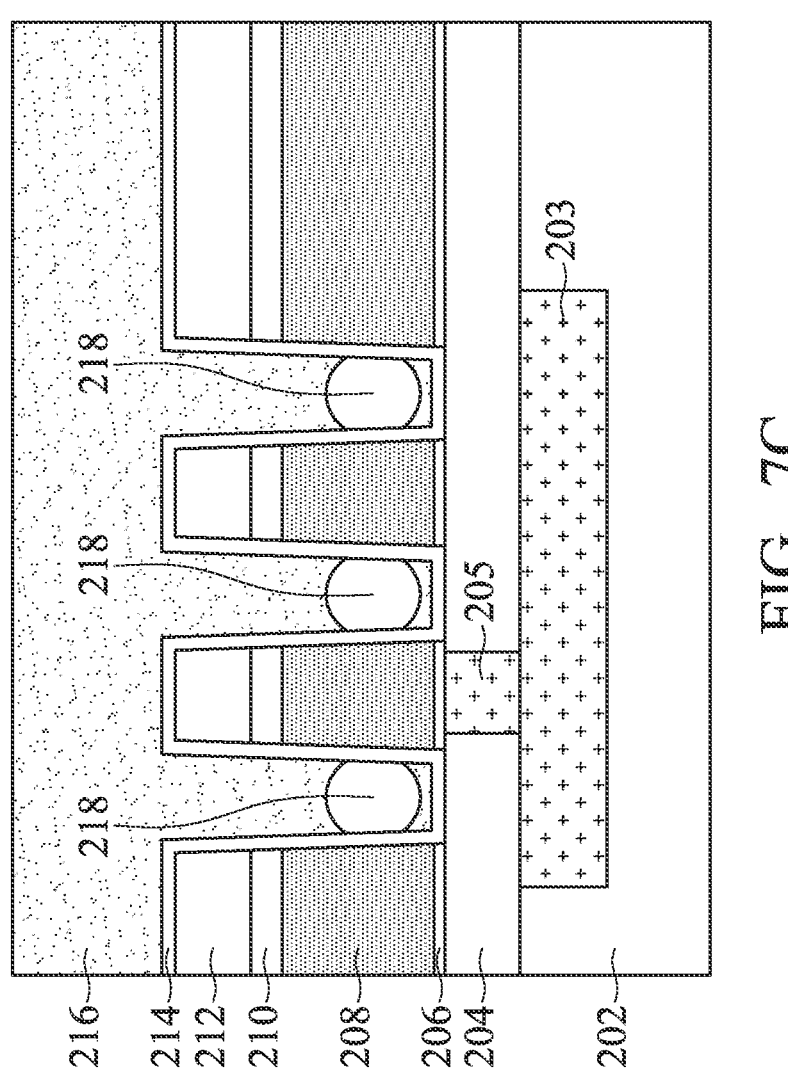

FIG. 7C illustrate another embodiment of a resultant structure after operation 112. Compared with FIG. 7B, one difference is that the dielectric material does not fully cover the sidewalls of the trenches 213. Therefore, the air gaps 218 still expose a portion of the sidewalls of the trenches 213, such that the air gaps 218 defined in the trenches 213 are capped by the dielectric material and expands laterally between the barrier layer 214 and vertically between the dielectric material of the dielectric layer 216.

Figure 8:
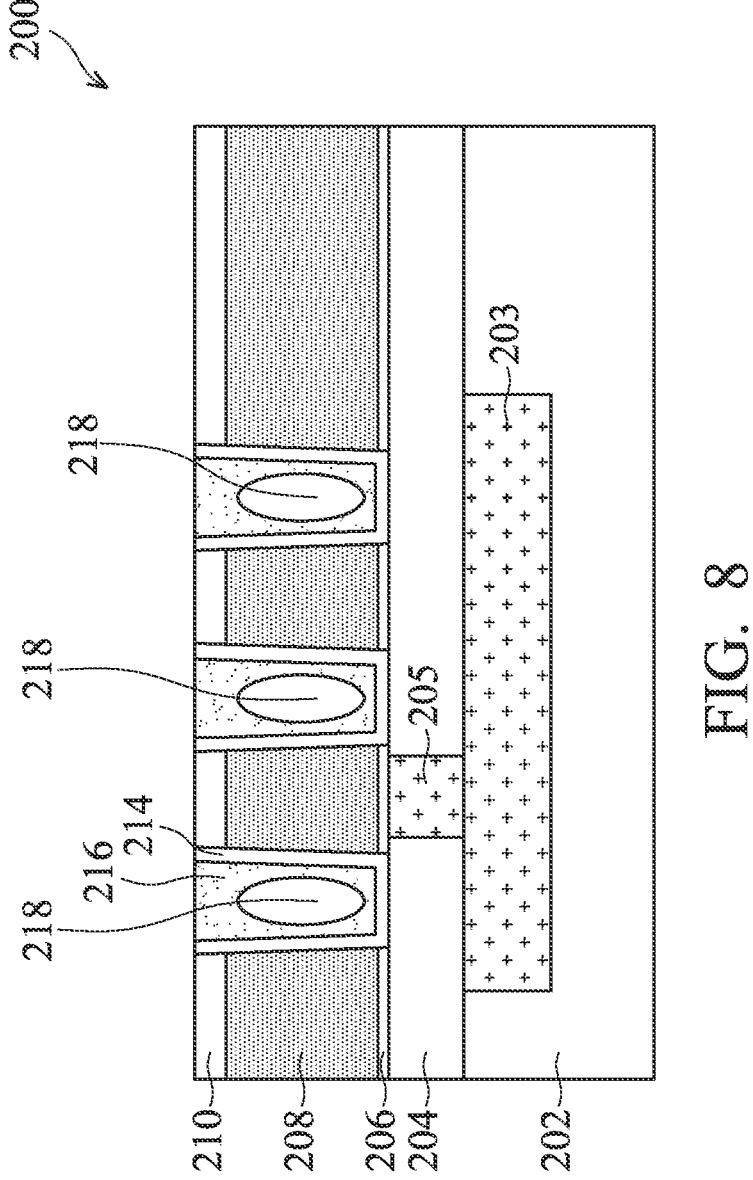

At operation 114, the method 100 (FIG. 1A) performs a planarization process, such as a CMP process to remove excess dielectric material of the dielectric layer 216. In some embodiments, the barrier layer 214 and the hard mask layer 212 are also removed from above the capping layer 210, such that the capping layer 210 are exposed, such as shown in FIG. 8. During the CMP process, the capping layer 210 may function as a CMP stop layer, such that the CMP process stops at the top surface of the capping layer 210. After the planarization, top surfaces of the capping layer, the barrier layer 214, and the dielectric layer 216 are substantially coplanar. In FIG. 8 and the following figures, the manufacturing operations after the structure shown in FIG. 7B is formed are explained. However, the same operations can be applied to the structures shown in FIGS. 7A and 7C as well.

Figure 9:
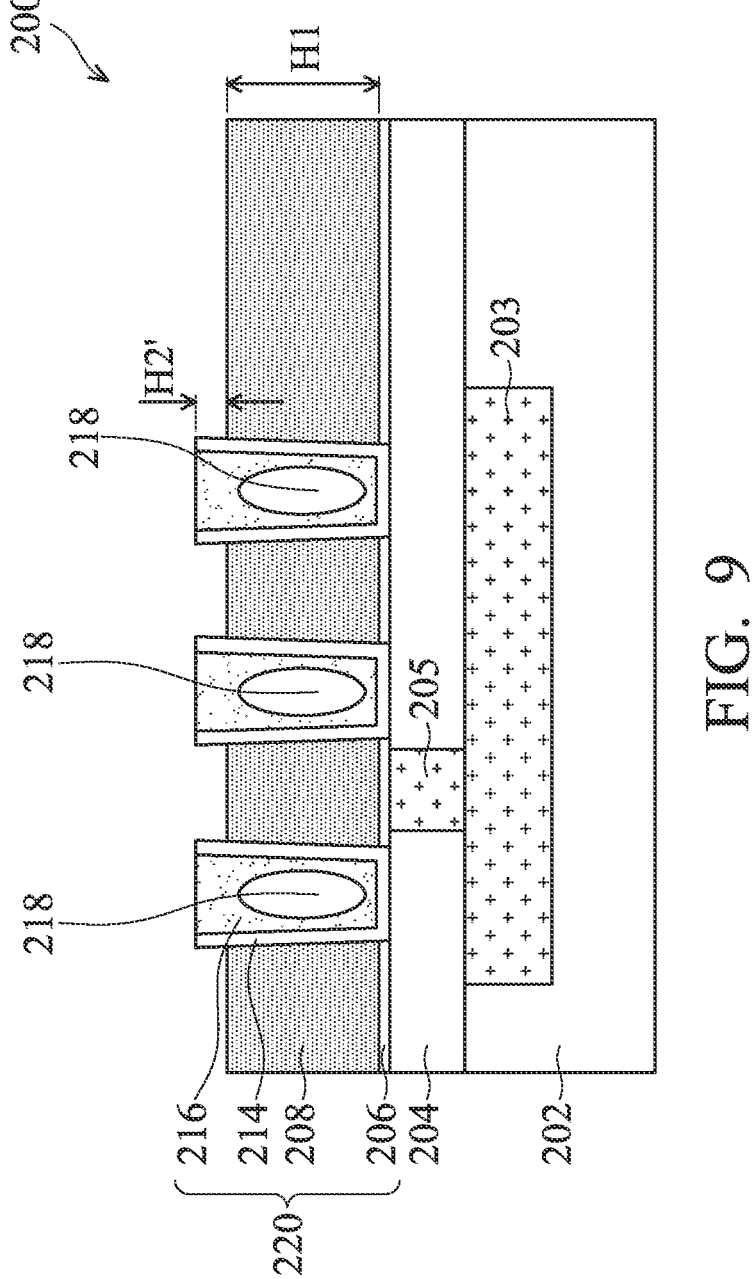

At operation 116, the method 100 (FIG. 1B) removes the capping layer 210 in a selective etching process. The resultant structure is shown in FIG. 9. The operation 116 may use a dry etching, a wet etching, or other suitable etching processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. Material compositions of the barrier layer 214 and the dielectric layer 216 are selected such that a high etch selectivity exists, and the selective etching process removes the capping layer 210 without causing substantial etching loss to the barrier layer 214 and the dielectric layer 216. Since the air gaps 218 are positioned below the capping layer 210, the dielectric layer 216 remains capping the air gaps 218 after operation 116.

After the removing of the capping layer 210, the dielectric layer 216 and the metal lines 208 disposed in the dielectric layer 216 (together with the glue layer 206 and the barrier layer 214) collectively form a layer of interconnect structure 220 (e.g., an $M_x$ interconnect layer). Top portions of the barrier layer 214 and the dielectric layer 216 protrude from the top surface of the metal lines 208 for a distance H2'. The upper portion of the dielectric layer 216 above the metal lines 208 functionally serves as a buffering layer against later over etching during via formation. The distance H2' substantially equals the thickness of the removed capping layer 210. In some embodiments, the distance H2' ranges from about 50 Å to about 120 Å. A ratio of H2'/H1 is constrained between about ⅕ to about ⅓, in accordance with some embodiments. As discussed above, if the distance H2' is less than about ⅕ of the thickness H1 of the metal layer 208, the thickness of the capping layer 210 is too thin to meet the film quality requirement. If the distance H2' is larger than about ⅓ of the thickness H1 of the metal layer 208, the dielectric layer 216 protrudes into upper dielectric layer (e.g., a subsequently-formed etch stop layer) for a large distance which introduces via under-etching.

Figure 10:
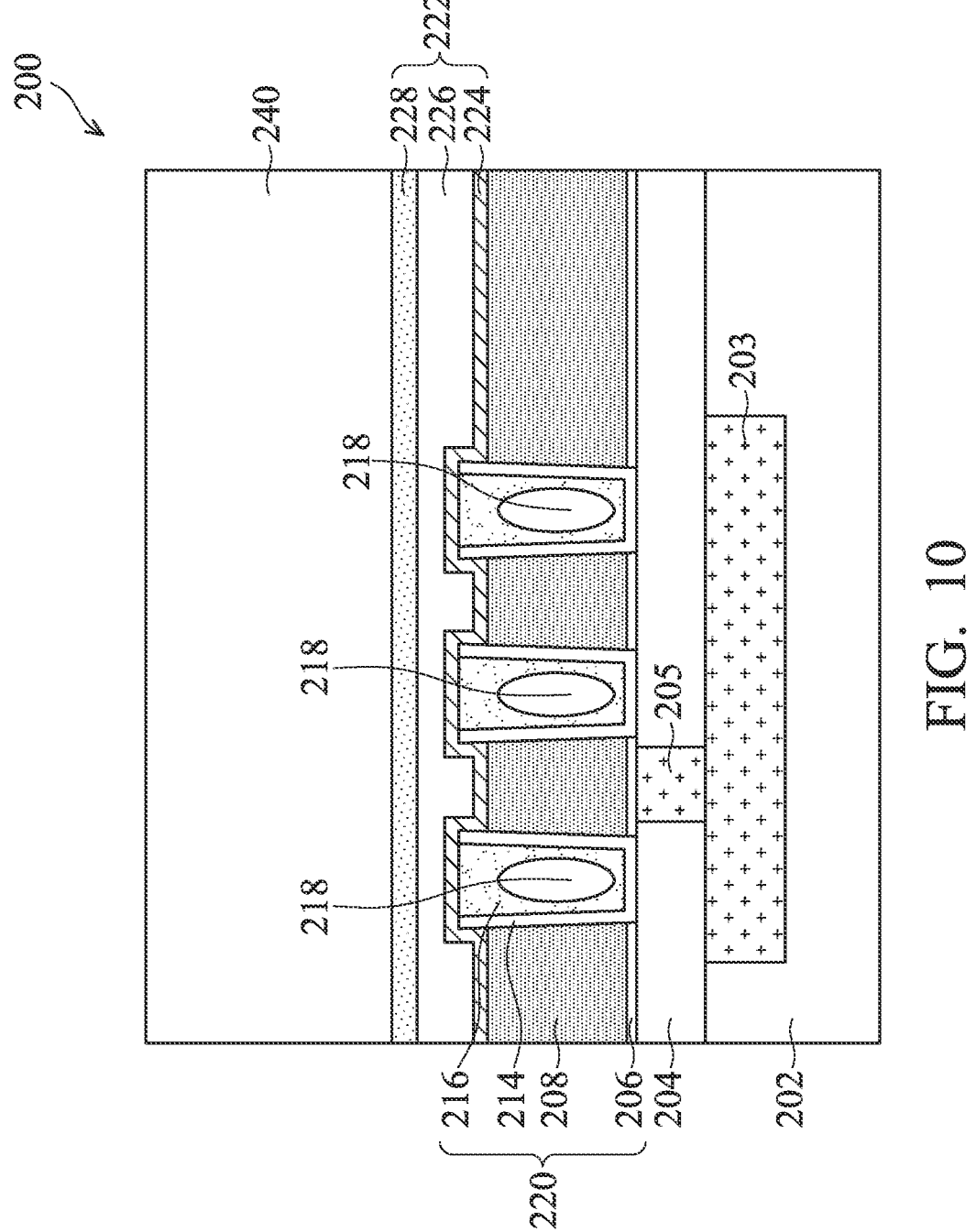

At operation 118, the method 100 (FIG. 1B) deposits an etch stop layer 222 over the layer of interconnect structure 220, such as shown in FIG. 10. Any suitable material or composition may be used in forming the etch stop layer 222. The exemplary etch stop layer 222 includes a first etch stop layer 224, a second etch stop layer 226, and a third etch stop layer 228. The first etch stop layer 228 is blanket deposited over the layer of interconnect structure 220, covering top surfaces of the metal lines 208 and dielectric layer 216 and sidewalls of the barrier layer 214. The first etch stop layer 224 comprises AlON having a thickness of about 10 Å to about 50 Å, in some embodiments. Alternatively, the first etch stop layer 224 may comprise other materials and dimensions. The second etch stop layer 226 is formed over the first etch stop layer 224. The second etch stop layer 226 comprises nitrogen-doped carbide (NDC), oxygen-doped carbide (ODC), hydrogen and nitrogen doped carbide (HNDC), SiC, tetraethyl orthosilicate (TEOS), or other films comprising a thickness of about 10 Å to about 200 Å, in some embodiments. Alternatively, the second etch stop layer 226 may comprise other materials and dimensions. The third etch stop layer 228 is formed over the second etch stop layer 226. The third etch stop layer 228 comprises AlOx having a thickness of about 10 Å to about 100 Å, in some embodiments. Alternatively, the third etch stop layer 228 may comprise other materials and dimensions. Each etch stop layer may be formed using ALD or CVD process, for example an ALD process in a chamber having a pressure of about 1 Torr to about 30 Torr, a frequency of about 13.56 MHz, at a power level of about 50 W to about 500 W, at a temperature of about 100° C. to about 400° C., and in the presence of or in an ambient of $N_2$, $H_2$, or $NH_3$. Alternatively, each etch stop layer may be formed using other suitable methods and process settings.

Still referring to FIG. 10, the method 100 (FIG. 1B) also forms a dielectric layer 240 over the etch stop layer 222 at operation 118. In some embodiments, the dielectric layer 240 includes silicon oxide, silicon nitride, a low-k material, an extreme low-k material, or a combination thereof. The formation of the dielectric layer 240 may include CVD, PECVD, FCVD, PVD, spin-on coating, or other suitable methods. In some embodiments, the dielectric layer 240 is similar to the dielectric layer 216 in term of material composition and deposition. In some alternative embodiments, the dielectric layer 240 and the dielectric layer 216 include different material compositions. For example, the dielectric layer 216 may have a higher dielectric constant (k) than that of the dielectric layer 240. After the deposition of the dielectric layer 240, a CMP process may be applied to planarize the top surface of the device 200.

Figure 11:
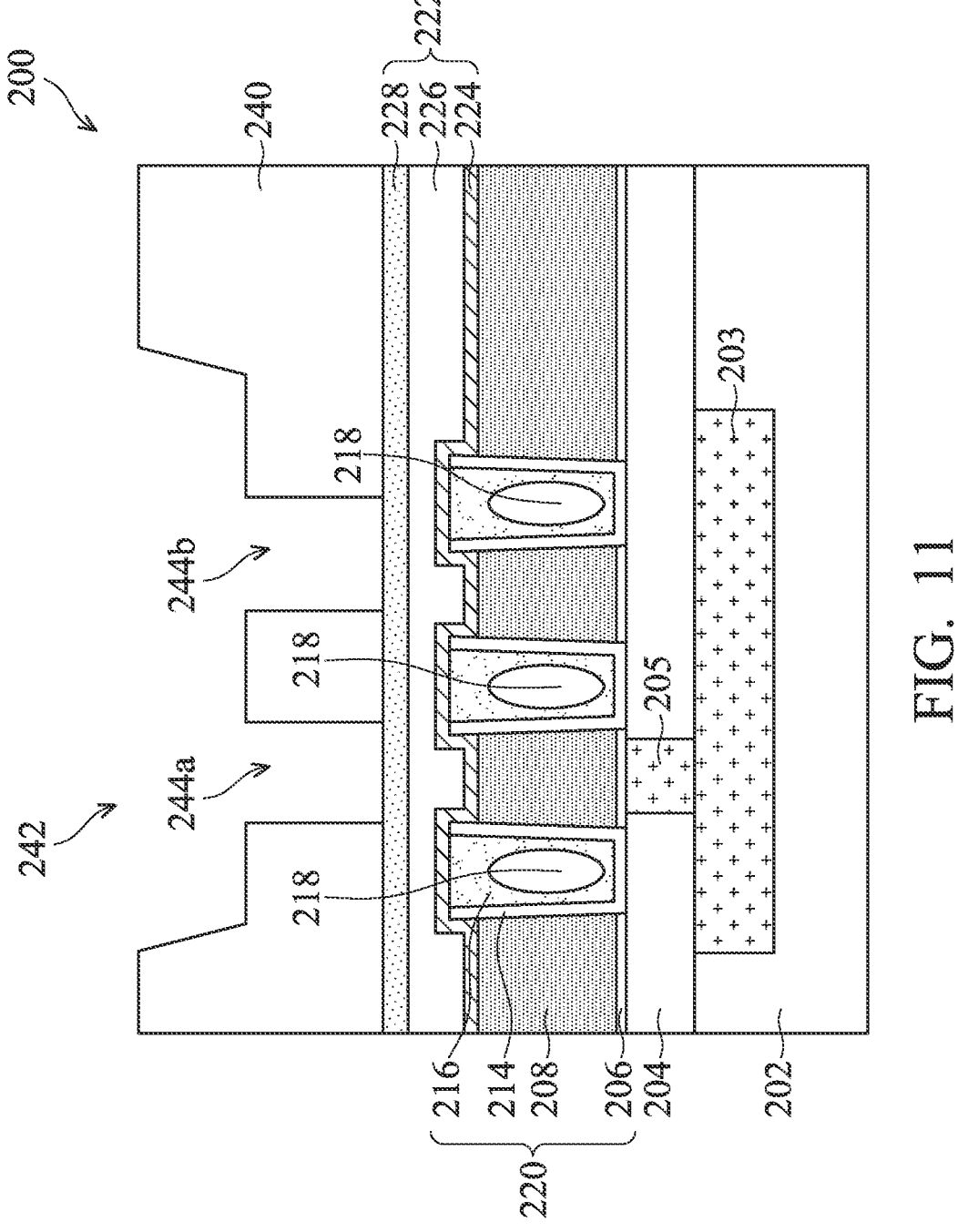

At operation 120, the method 100 (FIG. 1B) forms openings in the dielectric layer 240 through one or more etching processes. Referring to FIG. 11, the exemplary openings include the trench opening 242 and the via openings 244a and 244b (collectively as the via openings 244).

In some embodiments, operation 120 includes removing a top portion of the dielectric layer 240 in a first etching process to form the trench opening 242. The first etching process is implemented to partially etch the dielectric layer 240, such as by controlling the etching duration. During the first etching process, the dielectric layer 240 within the region defined by the trench opening 242 is only recessed but not completely through the dielectric layer 240. The formation of the trench opening 242 may be assisted by photoresist (not shown) for defining patterns. Photoresist is then removed in a suitable process such as resist stripping or plasma ashing. The dielectric layer 240 is further etched through the trench opening 242 by a second etching process to form the via openings 244. The second etching process is designed to selectively etch the dielectric layer 240 while the etch stop layer 222 substantially remains intact. The second etching process extends the via openings 244 downwardly, reaching the etch stop layer 222. The formation of the via openings 244 may also be assisted by photoresist (not shown) for defining patterns. Photoresist is then removed in a suitable process such as resist stripping or plasma ashing. After the second etching process, both the trench opening 242 for metal lines and the via openings 244 for via features are collectively formed in the dielectric layer 240. The trench opening 242 is formed in the upper portion of the dielectric layer 240 and the via openings 244 are formed in the lower portion of the dielectric layer 240.

In some embodiments, each of the first and second etching processes includes dry etch, wet etch or a combination thereof. The second etching process is designed with an etchant to have etching selectivity such that the second etching process substantially removes the dielectric material in the dielectric layer 240 while keeps the etch stop layer 222 intact. In some embodiments, the etchants used in the first and second etching process are the same. In some embodiments, the second etching process is a dry etch with more etching directionality. In some embodiments, the etchant in the second etching process includes fluorine-containing gas (such as $C_xF_y$, which x and y are proper integers), oxygen-containing gas (such as $O_2$), other suitable etching gas, or a combination thereof.

Figure 12:
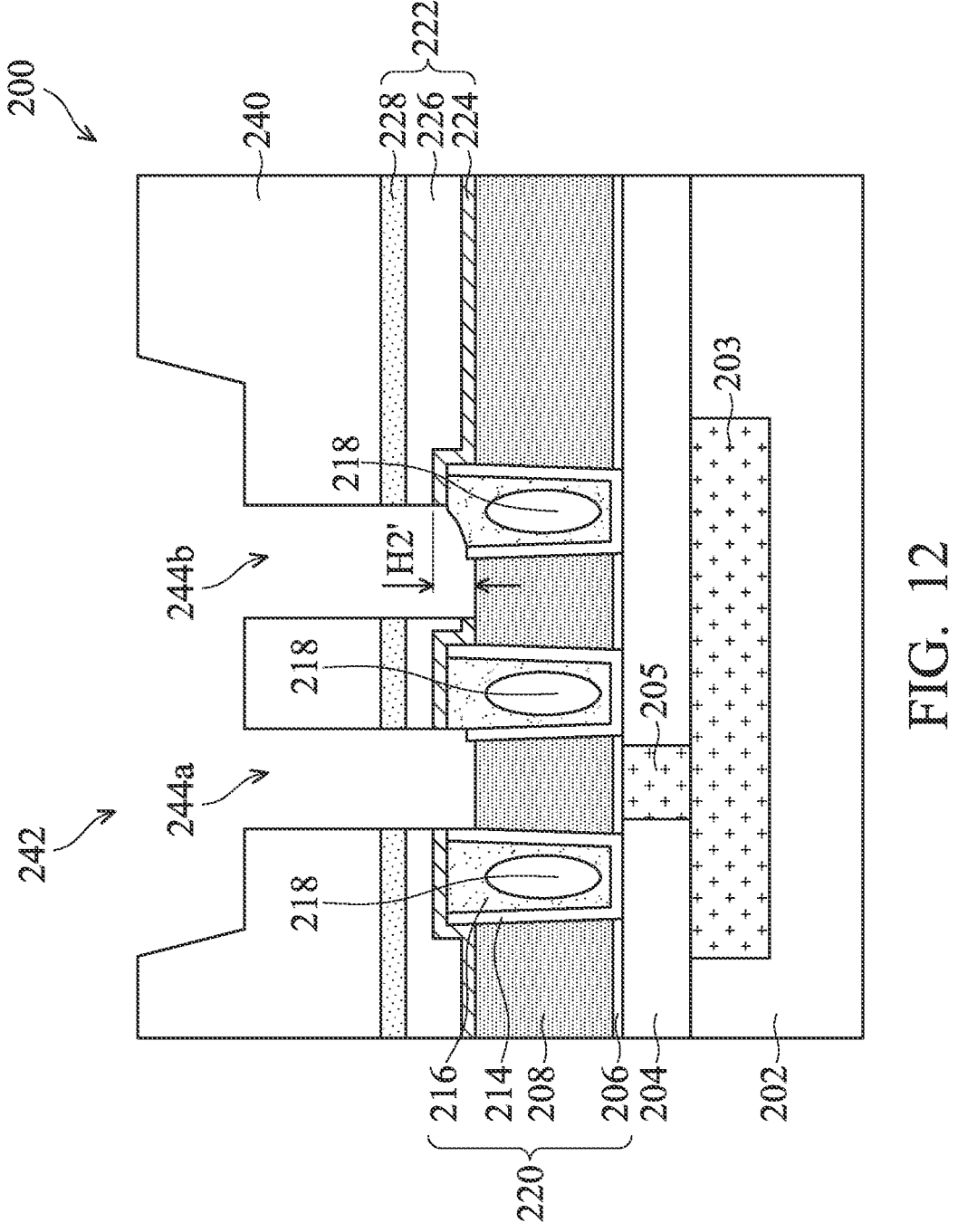

Referring to FIG. 12, after the formation of the trench opening 242 and the via openings 244, a third etching process, such as a wet etch, is applied to open the etch stop layer 222. In some embodiments, the third etching process is designed to first selectively etch the third etch stop layer 228 relative to the second etch stop layer 226, then selectively etch the second etch stop layer 226 relative to the first etch stop layer 224, and selectively etch the first etch stop layer 224 to expose the underneath metal lines 208 in the via openings 244.

The via openings 244 are expected to be aligned with the underlying metal lines 208. However, the lithography process has intrinsic misalignment. When the spaces between adjacent metal lines get smaller and smaller, the misalignment tolerances get smaller, which is a challenge to the corresponding lithography process. As an example shown in FIG. 12, both via openings 244a and 244b have some misalignment issue, which causes the via openings shift a little bit to the right with respect to the underneath metal lines 208. An edge of the via opening 244a overlaps with the barrier layer 214, and an edge of the via opening 244b overlaps with a top surface of the dielectric layer 216.

Regarding the via opening 244a, a sidewall of the dielectric layer 216 is exposed in the via opening 244a, but overall this portion of the dielectric layer 216 remains covered by the etch stop layer 222 and substantially intact during the third etching process. The barrier layer 214 on the misaligned edge of the via opening 244a is recessed and may be above (as illustrated) or coplanar (or aligned) with the exposed top surface of the metal lines 208. However, conventionally, the misalignment happened to the via opening 244b is more detrimental to the quality and reliability of the device than the misalignment happened to the via opening 244a. Conventionally, top surfaces of the dielectric layer 216 and the metal lines 208 are coplanar after a CMP process. Consequently, the third etching process for opening the etch stop layer 222 may inadvertently "punch through" the etch stop layer 222 and cause portions of the dielectric layer 216 therebelow to also be etched. Thereafter, when the etched via opening is filled with a conductive material to form a via feature, a portion of the via would extend into the recessed dielectric layer 216, resembling a "tiger tooth" positioned below a top surface of the metal lines 208. This "tiger tooth" effect is exacerbated as the misalignment between the via and the metal line worsens. As a result, device performance such as reliability (e.g., measured by time-dependent dielectric breakdown, or TDDB) may suffer. As a comparison, in the illustrated embodiment, the dielectric layer 216 and the barrier layer 214 are not coplanar with the top surface of the metal lines 208 but protrude for a distance H. The protruding top portions of the dielectric layer 216 provide a buffering material layer. Although portions of the top surface of dielectric layer 216 is recessed during the opening of etch stop layer 222, but the extra thickness allows an over etching during the via opening formation. The third etching process is implemented for an over etching of the etch stop layer 222, particularly the first etch stop layer 224, and keeping the recessed exposed top surface of the dielectric layer 216 above the metal lines 208, such as by controlling the etching duration. Accordingly, the disclosed method 100 provides a self-aligned process so that the misalignment between the underlying conductive features and the via openings is constrained and minimized. The via features to be formed in the via openings are self-aligned with the underlying conductive features, such as the metal lines 208.

Figure 13:
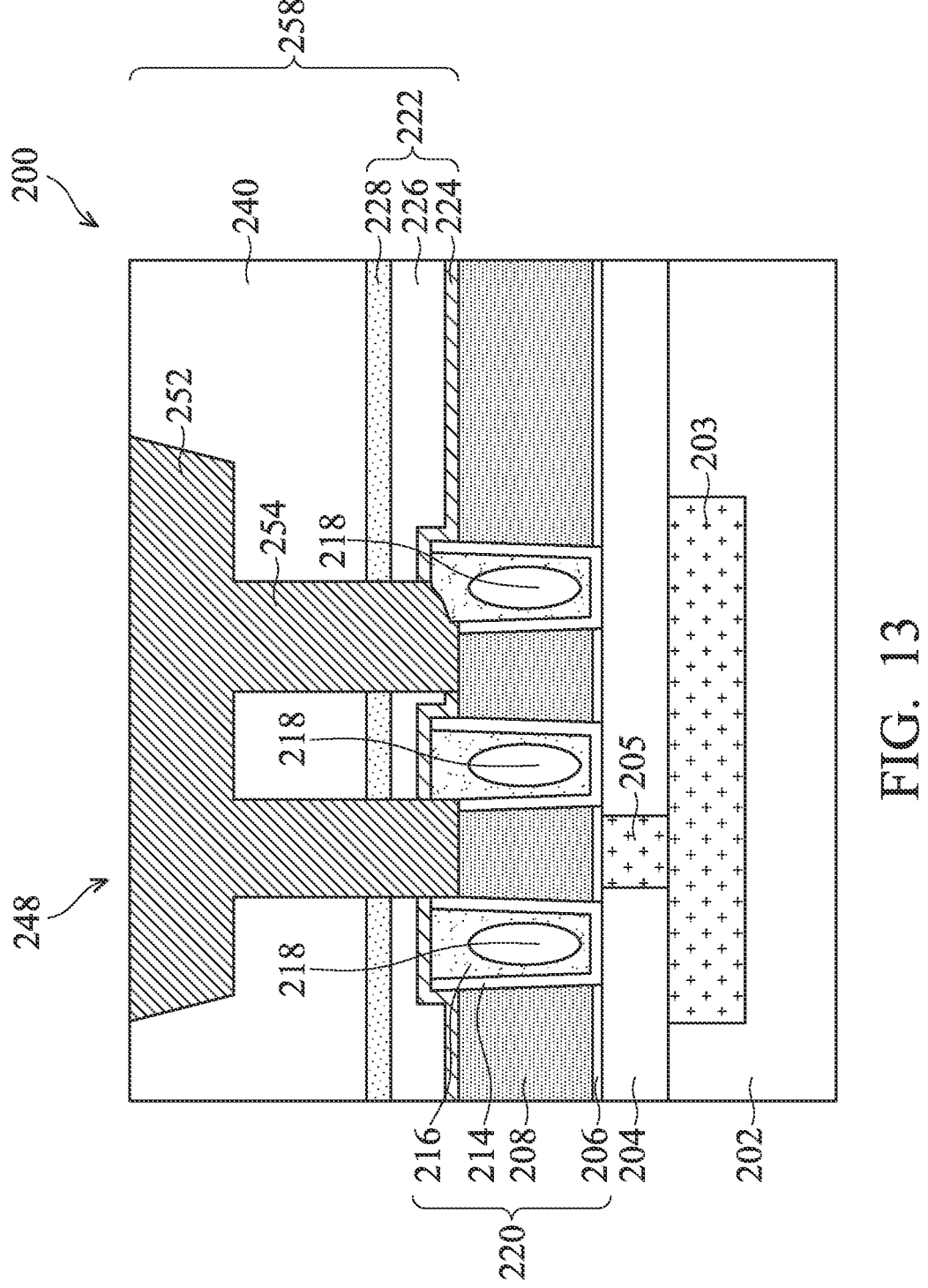
Figure 14A:
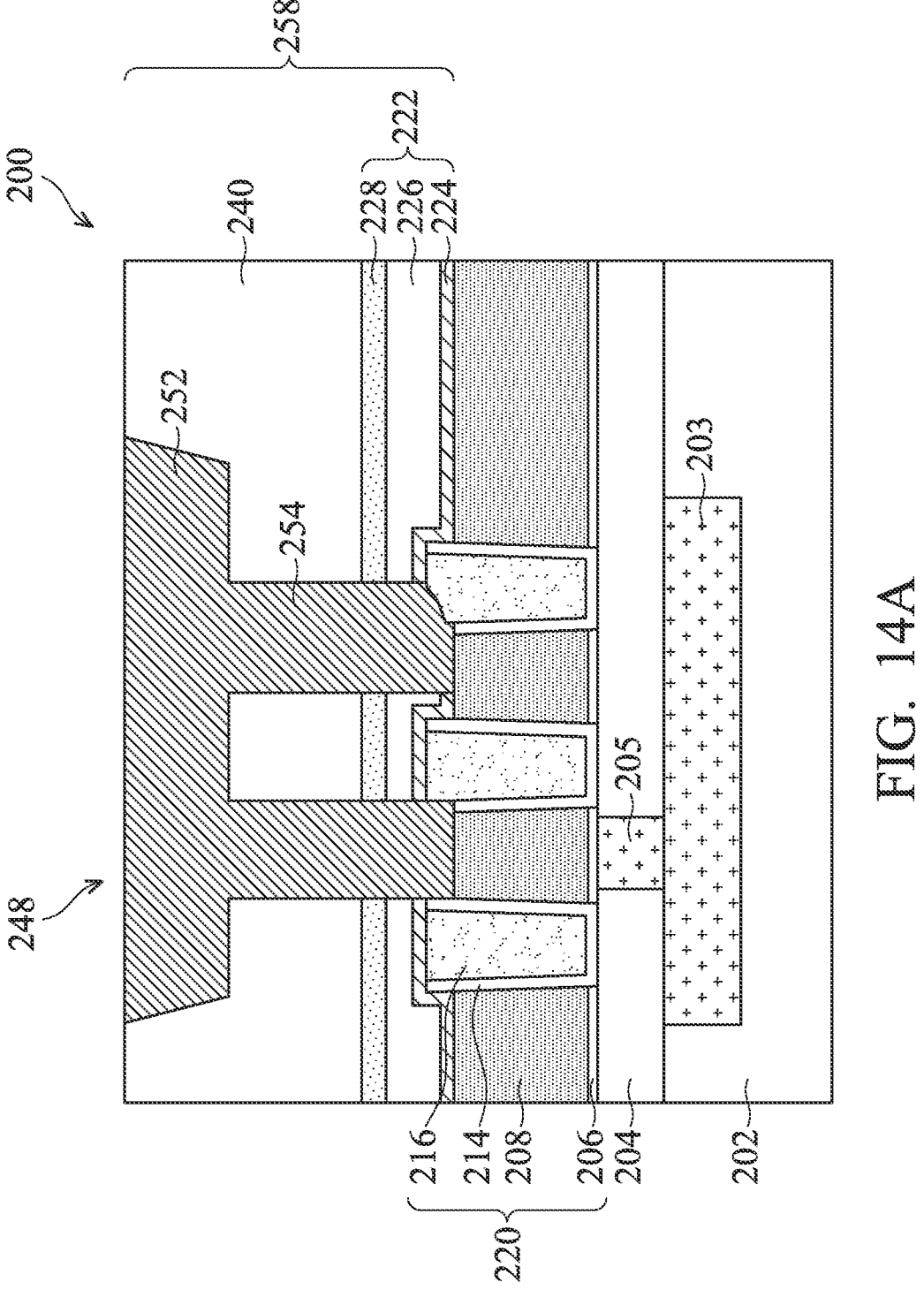
Figure 14B:
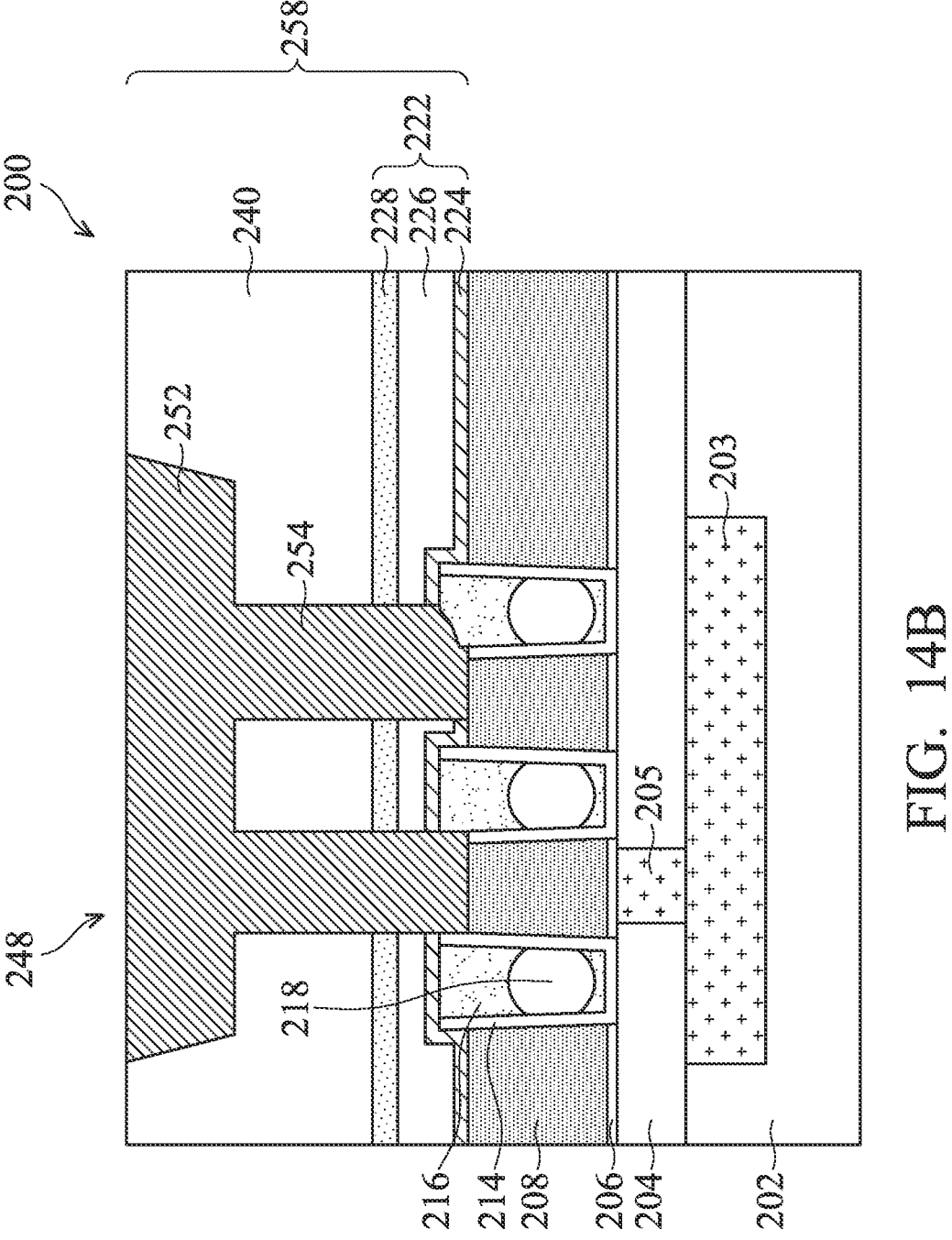

At operation 122, the method 100 (FIG. 1B) forms an overlying conductive feature 248 in the trench opening 242 and the via openings 244, such as shown in FIG. 13. The portion of the overlying conductive feature 248 in the trench opening 242 is also referred to as metal lines 252, and the portions in the via openings 244 is also referred to as vias 254. FIGS. 14A and 14B similarly illustrate other embodiments of the resultant structure after operation 122 based on the structure earlier shown in FIGS. 7A and 7C. The main difference among FIGS. 13, 14A, and 14B is the existence and positions of the air gaps 218.

In some embodiments, the overlying conductive feature 248 is formed as a bulk metal layer by filling a conductive material in the trench opening 242 and via openings 244 The conductive material may be deposited through suitable techniques such as an electroplating process, PVD, or other suitable methods. In one embodiment, the overlying conductive feature 248 is formed by a damascene process, such as a dual damascene process. One advantageous feature of having the bulk metal layer formed in a damascene process is that some low-resistive conductive material (e.g., copper) may not otherwise be suitable for metal etching process. In some embodiments, the conductive material is different from the metal used in the relatively narrow metal lines 208. In some embodiments, the metal lines 208 includes one or more noble metals as discussed above, while the bulk metal layer 248 includes one or more non-noble metals. For example, the bulk metal layer 248 may include copper (Cu), although other suitable materials such as tungsten (W), cobalt (Co), Nickel (Ni), aluminum (Al), combinations thereof, and/or the like, may alternatively be utilized. In some embodiments, the bulk metal layer 248 also includes a noble metal but different from the one used in the metal lines 208. For example, the bulk metal layer 248 may include Pt, while the metal lines 208 may include Ru, Ir, or Rh. In some alternative embodiments, the metal lines 208 and the bulk metal layer 248 both include non-noble, but different metals. For example, the metal lines 208 may include Mo or W, while the bulk metal layer 248 may include Cu.

The dielectric layer 240 and the metal lines 252 and vias 254 disposed in the dielectric layer 240 (may together with the etch stop layer 222) collectively form a layer of interconnect structure 258 (e.g., the $M_{x+1}$ interconnect layer). The vias 254 extend through the etching stop layer 222 and come into direct contact with the respective metal lines 208. The vias 254 are at least partially aligned with the underneath metal lines 208. Due to the protruding portions of the dielectric layer 216 and the barrier layer 214, the bottommost portion of the vias 254 remain above the top surfaces of the metal lines 208, and the "tiger tooth" via punch through is no longer a problem. Accordingly, the process windows for forming the vias can be relaxed, and the device performance may be improved as well. For example, since misalignment will likely not lead to the "tiger tooth" like via punch through, the vias 254 can be made to be bigger (e.g., wider lateral dimension) to ensure that there is physical contact between the vias and the underneath metal lines. The greater via size may reduce contact resistance, in addition to relaxing gap filling windows in the damascene process.

At operation 124, the method 100 (FIG. 1B) performs further fabrication processes to the device 200. For example, it may form more overlying layers of interconnect structure, form passivation layers on the device 200, perform other back-end-of-line (BEOL) processes, and complete the integrated circuit chip.

Although not intended to be limiting, one or more embodiments of the present disclosure provide many benefits to a semiconductor device and the formation thereof. For example, embodiments of the present disclosure provide a method that enlarges process window during via formation, which avoids the via punch through issue. The method also combines metal etching process and damascene process, providing interconnect structures including relatively narrow metal lines of a noble metal (or other suitable metal) through a metal etching process and relatively wide metal lines of copper (or other suitable metal) through damascene process. The conductivity of interconnection layers is improved even at the minimum metal line CDs. The method also effectively reduces dielectric constant (k) of the dielectric material in the interconnect structures. As a result, the RC performance of the device can be improved. Furthermore, the method for forming interconnect structures can be easily integrated into existing semiconductor fabrication processes.

In one exemplary aspect, the present disclosure is directed to a method of forming an interconnect structure. The method includes forming a metal layer over a substrate, the metal layer including a first metal; forming a capping layer on the metal layer; patterning the capping layer and the metal layer, thereby forming trenches in the metal layer; depositing a first dielectric layer in the trenches; removing the capping layer, resulting in the first dielectric layer protruding from a top surface of the metal layer; depositing a second dielectric layer over the first dielectric layer and the metal layer; forming an opening in the second dielectric layer, thereby partially exposing the top surface of the metal layer; and forming a conductive feature in the opening and in electrical coupling with the metal layer, the conductive feature including a second metal. In some embodiments, the first metal is a noble metal and the second metal is a non-noble metal. In some embodiments, the first metal is selected from Ru, Ir, Rh, and Pt, and the second metal is selected from Cu, W, Co, Ni, and Al. In some embodiments, the patterning of the metal layer includes reactive-ion etching. In some embodiments, the forming of the conductive feature includes a damascene process. In some embodiments, the first dielectric layer protrudes from the top surface of the metal layer for a distance from about 50 Å to about 120 Å. In some embodiments, the method further includes prior to the removing of the capping layer, performing a planarization process, such that top surfaces of the capping layer and the first dielectric layer are coplanar. In some embodiments, the capping layer includes tungsten carbide. In some embodiments, the method further includes prior to the depositing of the first dielectric layer, conformally depositing a barrier layer in the trenches, and after the removing of the capping layer, the barrier layer and the first dielectric layer both protrude from the top surface of the metal layer. In some embodiments, the depositing of the first dielectric layer caps an air gap between sidewalls of the trenches.

In another exemplary aspect, the present disclosure is directed to a method. The method includes forming a first conductive feature and a second conductive feature over a substrate, the first and second conductive features including a first metal; depositing a first dielectric layer in a trench between the first and second conductive features; depositing a second dielectric layer over the first and second conductive features and the first dielectric layer, a top surface of the first dielectric layer under the second dielectric layer being higher than top surfaces of the first and second conductive features; forming an opening in the second dielectric layer, the opening exposing one of the first and second conductive features; and forming a third conductive feature in the opening, the third conducive feature including a second metal different from the first metal. In some embodiments, the first metal is a noble metal selected from Ru, Ir, Rh, and Pt, and the second metal is a non-noble metal selected from Cu, W, Co, Ni, and Al. In some embodiments, the method further includes forming a capping layer over the first and second conductive features; performing a planarization process to planarize top surfaces of the capping layer and the first dielectric layer; and removing the capping layer, resulting in the first dielectric layer protruding from the top surfaces of the first and second conductive features. In some embodiments, the capping layer includes tungsten carbide. In some embodiments, the forming of the opening recesses a portion of the top surface of the first dielectric layer, where the third conductive feature is in contact with the portion of the top surface of the first dielectric layer, and where a bottommost portion of the third conductive feature is above the top surfaces of the first and second conductive features. In some embodiments, the depositing of the first dielectric layer forms an air gap in the trench.

In yet another exemplary aspect, the present disclosure is directed to a semiconductor structure. The semiconductor structure includes a substrate; a first layer of an interconnect structure formed over the substrate, wherein the first layer contains a first dielectric material and a first conductive feature disposed in the first dielectric material, wherein the first dielectric material is higher than the first conductive feature; an etch stop layer disposed on the first layer of the interconnect structure; and a second layer of the interconnect structure formed over the etch stop layer, wherein the second layer contains a second dielectric material and a second conductive feature disposed in the second dielectric material, where the second conductive feature is at least partially aligned with, and electrically coupled to, the first conductive feature. In some embodiments, the first dielectric material is higher than the first conductive feature for a distance from about 50 Å to about 120 Å. In some embodiments, the semiconductor structure further includes an air gap trapped in the first dielectric material. In some embodiments, the first conductive feature includes a noble metal and the second conductive feature includes a non-noble metal.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an interconnect structure, comprising:

forming a metal layer extending continuously over a substrate, the metal layer including a first metal;

forming a capping layer on the metal layer, wherein the metal layer separates the capping layer from physically contacting the substrate;

patterning the capping layer and the metal layer collectively, thereby dividing the metal layer from a continuous form into discrete segments by forming trenches through the metal layer, the trenches exposing the substrate;

conformally depositing a barrier layer in the trenches, wherein the barrier layer is in direct physical contact with each of the segments of the metal layer, wherein the barrier layer has a horizontal portion disposed at a bottom of the trenches and in direct physical contact with the substrate;

depositing a first dielectric layer in the trenches, wherein a bottom portion of the first dielectric layer is in direct physical contact with the horizontal portion of the barrier layer;

fully removing the capping layer, resulting in the first dielectric layer protruding from a top surface of the metal layer;

depositing a second dielectric layer over the first dielectric layer and the metal layer, wherein after the depositing of the second dielectric layer, the bottom portion of the first dielectric layer remains in direct physical contact with the horizontal portion of the barrier layer;

forming an opening in the second dielectric layer, thereby partially exposing the top surface of the metal layer; and forming a conductive feature in the opening and in electrical coupling with the metal layer, the conductive feature including a second metal.

2. The method of claim 1, wherein the first metal is a noble metal and the second metal is a non-noble metal.

3. The method of claim 2, wherein the first metal is selected from Ru, Ir, Rh, and Pt, and the second metal is selected from Cu, W, Co, Ni, and Al.

4. The method of claim 1, wherein the patterning of the metal layer includes reactive-ion etching.

5. The method of claim 1, wherein the forming of the conductive feature includes a damascene process.

6. The method of claim 1, wherein the first dielectric layer protrudes from the top surface of the metal layer for a distance from about 50 Å to about 120 Å.

7. The method of claim 1, further comprising:

prior to the removing of the capping layer, performing a planarization process, such that top surfaces of the capping layer and the first dielectric layer are coplanar.

8. The method of claim 1, wherein the capping layer includes tungsten carbide.

9. The method of claim 1, wherein after the removing of the capping layer, the barrier layer and the first dielectric layer both protrude from the top surface of the metal layer.

10. The method of claim 1, wherein the depositing of the first dielectric layer caps an air gap between sidewalls of the trenches.

11. A method, comprising:

forming a first conductive feature and a second conductive feature over a substrate, the first and second conductive features including a first metal;

depositing a barrier layer and a first dielectric layer in a trench between the first and second conductive features, wherein the barrier layer is in direct physical contact with both the first and second conductive features, wherein the barrier layer includes a bottom portion below top surfaces of the first and second conductive features, the bottom portion of the barrier layer includes a bottom surface in direct physical contact with the substrate and a top surface facing away from the substrate, and the first dielectric layer includes a bottom portion below the top surfaces of the first and second conductive features and in direct physical contact with the top surface of the bottom portion of the barrier layer;

depositing a second dielectric layer over the first and second conductive features and the first dielectric layer, a top surface of the first dielectric layer under the second dielectric layer being higher than the top surfaces of the first and second conductive features, wherein after the depositing of the second dielectric layer, the bottom portion of the first dielectric layer remains in direct physical contact with the top surface of the bottom portion of the barrier layer, and wherein the second dielectric layer is in direct physical contact with both the first and second conductive features;

forming an opening in the second dielectric layer, the opening exposing one of the first and second conductive features; and forming a third conductive feature in the opening, the third conducive feature including a second metal different from the first metal.

12. The method of claim 11, wherein the first metal is a noble metal selected from Ru, Ir, Rh, and Pt, and the second metal is a non-noble metal selected from Cu, W, Co, Ni, and Al.

13. The method of claim 11, further comprising:

forming a capping layer over the first and second conductive features;

performing a planarization process to planarize top surfaces of the capping layer and the first dielectric layer; and removing the capping layer, resulting in the first dielectric layer protruding from the top surfaces of the first and second conductive features.

14. The method of claim 13, wherein the capping layer includes tungsten carbide.

15. The method of claim 11, wherein the forming of the opening recesses a portion of the top surface of the first dielectric layer, wherein the third conductive feature is in direct physical contact with the portion of the top surface of the first dielectric layer, and wherein a bottommost portion of the third conductive feature is above the top surfaces of the first and second conductive features.

16. The method of claim 11, wherein the depositing of the first dielectric layer forms an air gap in the trench.

17. A method, comprising:

forming a glue layer over a substrate;

forming a metal layer over the glue layer;

forming a capping layer over the metal layer;

patterning the capping layer, the metal layer, and the glue layer collectively, thereby forming trenches exposing the substrate;

depositing a barrier liner in the trenches;

forming a first dielectric layer in the trenches;

performing a planarization process, such that top surfaces of the capping layer, the barrier liner, and the first dielectric layer are coplanar;

fully removing the capping layer, such that the first dielectric layer and the barrier liner protrude from a top surface of the patterned metal layer, wherein the first dielectric layer traps an air gap under the top surface of the patterned metal layer with a bottom portion of the first dielectric layer directly under the air gap;

depositing a second dielectric layer over the first dielectric layer, the barrier liner, and the patterned metal layer, wherein after the depositing of the second dielectric layer, the bottom portion of the first dielectric layer remains directly under the air gap;

forming an opening in the second dielectric layer, thereby exposing the top surface of the patterned metal layer; and forming a conductive feature in the opening and in electrical coupling with the patterned metal layer.

18. The method of claim 17, wherein the metal layer includes a first metal, and the conductive feature includes a second metal different from the first metal.

19. The method of claim 17, wherein the first dielectric material is higher than the top surface of the patterned metal layer for a distance from about 50 Å to about 120 Å.

20. The method of claim 17, wherein a bottom surface of the barrier liner is lower than a bottom surface of the metal layer.

* * * * *